(12) United States Patent
Ikeda et al.

(10) Patent No.: US 10,084,022 B2
(45) Date of Patent: Sep. 25, 2018

(54) DISPLAY DEVICE

(71) Applicant: Semiconductor Energy Laboratory Co., Ltd., Atsugi-shi, Kanagawa-ken (JP)

(72) Inventors: Hisao Ikeda, Kanagawa (JP); Yoshiharu Hirakata, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/641,486

(22) Filed: Jul. 5, 2017

(65) Prior Publication Data

US 2018/0012943 A1    Jan. 11, 2018

(30) Foreign Application Priority Data

Jul. 8, 2016 (JP) ................. 2016-136301

(51) Int. Cl.
*H01L 27/14* (2006.01)
*H01L 27/32* (2006.01)
*H01L 27/12* (2006.01)

(52) U.S. Cl.
CPC ...... *H01L 27/3216* (2013.01); *H01L 27/3246* (2013.01); *H01L 27/3262* (2013.01);
(Continued)

(58) Field of Classification Search
CPC ..... H01L 21/75; H01L 27/12; H01L 51/5256; H01L 27/322; H01L 27/3244;
(Continued)

(56) References Cited

U.S. PATENT DOCUMENTS 9,088,006 B2    7/2015 Yamazaki et al.
9,577,222 B2    2/2017 Seo et al.
(Continued)

FOREIGN PATENT DOCUMENTS

JP    2014-197522 A    10/2014

OTHER PUBLICATIONS

Kusunoki.K et al., "Transmissive OLED and Reflective LC Hybrid (TR-Hybrid) Display", SID Digest '16 : SID International Symposium Digest of Technical Papers, May 22, 2016, vol. 47, pp. 57-60.
(Continued)

*Primary Examiner* — Thinh T Nguyen
(74) *Attorney, Agent, or Firm* — Fish & Richardson P.C.

(57) ABSTRACT

A display device with high resolution is provided. A thin display device is provided. A highly reliable display device is provided. The display device includes a display portion having a first display element which is positioned on one surface side of a first insulating layer and a second display element and a third display element which are positioned on the other surface side of the first insulating layer. The display portion has a region in which first display element and the second display element do not overlap with each other, and a region in which the first display element and the third display element partly do not overlap with each other. Furthermore, light emitted by the first display element, light emitted by the second display element, and light emitted by the third display element are released in the same direction.

27 Claims, 22 Drawing Sheets

(52) U.S. Cl.
CPC .... *H01L 27/1214* (2013.01); *H01L 2227/323* (2013.01); *H01L 2227/326* (2013.01)

(58) Field of Classification Search
CPC ............. H01L 27/3276; H01L 51/5237; H01L 51/5246; H01L 217/3258; H01L 51/0097; H01L 51/5338
USPC ............ 257/72, 59, 79, 89; 438/48, 128, 22, 438/149, 151
See application file for complete search history.

(56) References Cited

U.S. PATENT DOCUMENTS

| | | | |
|---|---|---|---|
| 9,627,648 | B2 | 4/2017 | Yamazaki et al. |
| 2014/0117339 | A1* | 5/2014 | Seo ........................ H01L 51/504 257/40 |
| 2017/0025444 | A1 | 1/2017 | Hirakata |
| 2017/0098689 | A1 | 4/2017 | Ikeda et al. |
| 2017/0155092 | A1 | 6/2017 | Seo et al. |

OTHER PUBLICATIONS

Sakuishi.T et al., "Transmissive OLED and Reflective LC Hybrid (TR-Hybrid) Display with High Visibility and Low Power Consumption", SID Digest '16 : SID International Symposium Digest of Technical Papers, May 22, 2016, vol. 47, pp. 735-738.

Ohide.T et al., "Application of Transfer Technology to Manufacturing of Transmissive OLED and Reflective LC Hybrid (TR-Hybrid) Display", SID Digest '16 : SID International Symposium Digest of Technical Papers, May 22, 2016, vol. 47, pp. 1002-1004.

* cited by examiner

DISPLAY DEVICE

BACKGROUND OF THE INVENTION

1. Field of the Invention

One embodiment of the present invention relates to a display device.

Note that one embodiment of the present invention is not limited to the above technical field. Examples of the technical field of one embodiment of the present invention disclosed in this specification and the like include a semiconductor device, a display device, a light-emitting device, a lighting device, a power storage device, a memory device, a driving method thereof, and a manufacturing method thereof.

2. Description of the Related Art

Display devices using organic electroluminescent (EL) elements or liquid crystal elements have been known. Examples of the display device also include a light-emitting device provided with a light-emitting element such as a light-emitting diode (LED), and electronic paper performing display with an electrophoretic method or the like.

The organic EL element generally has a structure in which a layer containing a light-emitting organic compound is provided between a pair of electrodes. By voltage application to this element, the light-emitting organic compound can emit light. A display device including such an organic EL element can be thin and lightweight and have high contrast and low power consumption.

Patent Document 1 discloses a flexible light-emitting device using an organic EL element.

REFERENCE

Patent Document

[Patent Document 1] Japanese Published Patent Application No. 2014-197522

SUMMARY OF THE INVENTION

In recent years, high-definition display panels used in display portions of portable information terminals, such as mobile phones, smartphones, and tablets, have been developed. Accordingly, the display devices are required to have higher definition. For example, as compared with large-sized devices like home-use television sets, relatively small-sized portable information terminals need to have higher definition to have increased resolution.

An object of one embodiment of the present invention is to provide a display device with high resolution. Another object is to provide a thin display device. Another object is to provide a highly reliable display device.

Note that the descriptions of these objects do not disturb the existence of other objects. One embodiment of the present invention does not necessarily achieve all the objects described above. Objects other than the above objects can be derived from the description of the specification and like.

One embodiment of the present invention is a display device having a display portion including a first display element, a second display element, a third display element, and a first insulating layer. In the display device, the second display element and the third display element are positioned on the opposite side of the first insulating layer from the first display element side. The display portion has a region in which the first display element and the second display element do not overlap with each other. The display portion has a region in which the first display element and the third display element do not overlap with each other. The first display element includes a first light-emitting layer configured to emit first light. The second display element includes a second light-emitting layer configured to emit second light. The third display element includes a third light-emitting layer configured to emit third light. The second light-emitting layer and the third light-emitting layer are positioned apart from each other. The first light, the second light, and the third light are of different colors from one another and released in the same direction.

The second light and the third light are preferably emitted toward the first insulating layer and pass through the first insulating layer. Alternatively, the first light is preferably emitted toward the first insulating layer and passes through the first insulating layer.

The above embodiment preferably includes a first transistor, a second transistor, a second insulating layer, and a third insulating layer. In this embodiment, the first transistor and the second transistor are preferably positioned on the same surface. The second insulating layer is preferably positioned between the first display element and the first transistor. The third insulating layer is preferably positioned between the second display element and the second transistor. A part of the first insulating layer preferably functions as a gate insulating layer of the first transistor, and another part of the first insulating layer preferably functions as a gate insulating layer of the second transistor. The first transistor and the first display element are preferably electrically connected to each other through a first opening included in the second insulating layer. The second transistor and the second display element are preferably electrically connected to each other through a second opening included in the third insulating layer.

In the above embodiment, the first display element preferably includes a first conductive layer and a second conductive layer. The second display element preferably includes a third conductive layer and a fourth conductive layer. In this embodiment, the first conductive layer, the first light-emitting layer, and the second conductive layer are preferably stacked in this order from the second insulating layer side. The first conductive layer is preferably electrically connected to the first transistor through the first opening. The third conductive layer, the second light-emitting layer, and the fourth conductive layer are preferably stacked in this order from the third insulating layer side. The third conductive layer is preferably electrically connected to the second transistor through the second opening.

In the above embodiment, a surface of the first conductive layer on the first light-emitting layer side and a surface of the second insulating layer on the first light-emitting layer side are preferably positioned on the same plane.

In the above embodiment, a surface of the third conductive layer on the second light-emitting layer side and a surface of the third insulating layer on the second light-emitting layer side are preferably positioned on the same plane.

In the above embodiment, the second light-emitting layer preferably includes a phosphorescent material, the third light-emitting layer preferably includes a fluorescent material, and the third light-emitting layer preferably includes a region overlapping with the second light-emitting layer.

In the above embodiment, the third light preferably includes light with a wavelength shorter than a wavelength of the second light, and the third light-emitting layer preferably includes a region overlapping with the second light-emitting layer.

Furthermore, the above embodiment preferably includes a plurality of the first display elements, a plurality of the second display elements, and a plurality of the third display elements. In this example, the second display elements preferably alternate with the third display elements in a first direction. The second display elements are preferably aligned in a second direction orthogonal to the first direction, and the third display elements are preferably aligned in the second direction. One of the first display elements is preferably positioned between one of the second display elements and one of the third display elements which are adjacent to each other in the first direction.

Alternatively, the second display elements preferably alternate with the third display elements in a third direction. The second display elements preferably alternate with the third display elements in a fourth direction orthogonal to the third direction. One of the first display elements is preferably positioned between one of the second display elements and one of the third display elements which are adjacent to each other in the third direction. Moreover, one of the first display elements is preferably positioned between one of the second display elements and one of the third display elements which are adjacent to each other in the fourth direction.

With one embodiment of the present invention, a display device with high resolution can be provided. Furthermore, a thin display device can be provided. Moreover, a highly reliable display device can be provided.

Note that one embodiment of the present invention does not necessarily have all the effects described above. Other effects can be derived from the description of the specification and the like.

BRIEF DESCRIPTION OF THE DRAWINGS

In the accompanying drawings.

DETAILED DESCRIPTION OF THE INVENTION

Figure 1A:
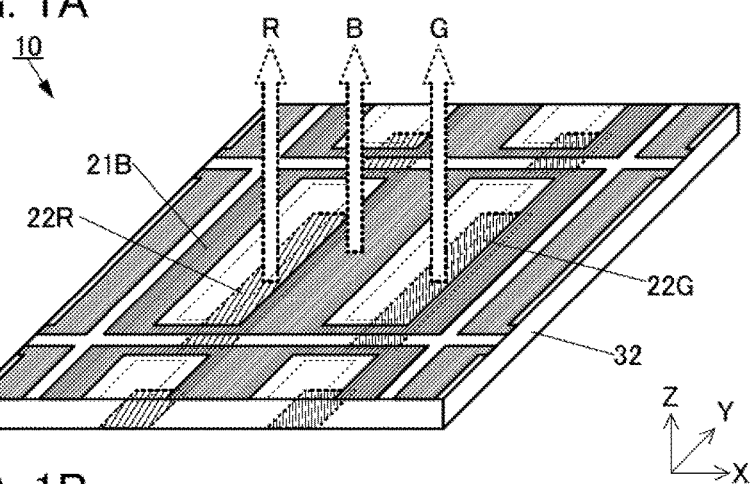
FIGS. 1A to 1C illustrate a display device according to an embodiment.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments.

Note that in structures of the invention described below, the same portions or portions having similar functions are denoted by the same reference numerals in different drawings, and the description thereof is not repeated. Furthermore, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first," "second," and the like are used in order to avoid confusion among components and do not limit the number.

A transistor is a kind of semiconductor elements and can cause amplification of current or voltage, switching operation for controlling conduction and non-conduction, or the like. A transistor in this specification includes an insulated-gate field effect transistor (IGFET) and a thin film transistor (TFT).

Embodiment 1

In this embodiment, examples of a display device of one embodiment of the present invention will be described.

A display device of one embodiment of the present invention has a display portion including a first display element which is positioned on one surface side of a first insulating layer and a second display element and a third display element which are positioned on the other surface side of the first insulating layer. The display portion has a region in which first display element and the second display element do not overlap with each other, and a region in which the first display element and the third display element do not overlap with each other.

Furthermore, light emitted by the first display element, light emitted by the second display element, and light emitted by the third display element are released in the same direction. For example, in the case where the first display element is positioned on the viewer side of the first insulating layer, light emitted by the second display element and the third display element is released toward the viewer side through the first insulating layer. Alternatively, for example, in the case where the second display element and the third display element are positioned on the viewer side of the first insulating layer, light emitted by the first display element is released toward the viewer side through the first insulating layer.

For example, when the first display element, the second display element, and the third display element each emit any one of red (R) light, green (G) light, and blue (B) light, a full-color display device can be achieved. Note that the first display element, the second display element, and the third display element may emit light of a color different from the above-mentioned colors, or the display device may include another display element that emits light of a color different from the above-mentioned colors.

This structure facilitates higher resolution as compared with the case where the first display element, the second display element, and the third display element are arranged side by side on the same surface.

A light-emitting element including a light-emitting layer is suitably used as each of the first display element, the second display element, and the third display element. Note that a display element other than the light-emitting element can be used as well.

In one embodiment of the present invention, two display elements (e.g., the first and second display elements, or the first and third display elements) adjacent to each other when seen from the display surface side can be arranged so as to alternate with each other with the first insulating layer therebetween. Owing to this, as compared with the case where the first display element, the second display element, and the third display element are provided side by side on the same plane, the distance between the display elements provided on the same plane can be increased without the constraint of resolution.

In particular, in one embodiment of the present invention, light-emitting layers of the two display elements (the second display element and the third display element) positioned on the other surface side of the first insulating layer are preferably formed separately. Even when such a method of separately forming different light-emitting layers is used, a display device with extremely high resolution can be provided because, as described above, the distance between two adjacent light-emitting elements on the same surface can be increased without the constraint of resolution. It is preferable that light-emitting layers formed separately be included in light-emitting elements showing different colors because effects such as an increase in color purity and in light extraction efficiency and a reduction in driving voltage can be obtained.

In the case where light-emitting layers of the second display element and the third display element are formed separately, a light-emitting layer in one of the display elements may extend to the other display element. This can simplify the process of separately forming light-emitting layers. In this case, the light-emitting layer can function as a carrier-transport layer or the like. It is particularly preferable to extend a light-emitting layer of the light-emitting element that emits light with a shorter wavelength of the two light-emitting elements (i.e., a light-emitting layer containing a light-emitting material with a wider bandgap) to the other light-emitting element.

It is preferable that the first display element and the second display element positioned on the opposite sides of the first insulating layer be individually electrically connected to a transistor. The transistor is a transistor (hereinafter also referred to as a driver transistor) for drive control of the first display element or the second display element. For example, when a light-emitting element is used as each of the first display element and the second display element, the transistor has a function of controlling the amount of current flowing through the light-emitting element. In addition to the transistor electrically connected to the first display element or the second display element, a transistor (hereinafter also referred to as a selection transistor) having a function of selecting a pixel (subpixel) is preferably provided.

The first insulating layer is preferably an insulating layer which constitutes part of the driver transistor or the selection transistor. For example, part of the first insulating layer preferably functions as a gate insulating layer of the driver transistor or the selection transistor. Alternatively, part of the first insulating layer may be a surface on which the driver transistor or the selection transistor is formed.

At least one of the driver transistor and the selection transistor (hereinafter also simply referred to as a transistor) is preferably positioned between a second insulating layer and a third insulating layer. In this case, for example, the second insulating layer has a surface on which a transistor is formed, and the third insulating layer is provided to cover the transistor.

At this time, one of the first display element and the second display element is provided on the opposite side of the second insulating layer from the transistor side, and the other of the first display element and the second display element is provided on the opposite side of the third insulating layer from the transistor side. In this case, the first display element and the second display element can be electrically connected to the driver transistor through an opening provided in the second insulating layer and an opening provided in the third insulating layer, respectively.

In particular, it is preferable that the first display element be provided on the opposite side of the third insulating layer from the transistor side. At this time, it is preferable that a surface of the electrode positioned on the transistor side of a pair of electrodes included in the first display element and a surface of the third insulating layer be positioned on the same plane. In other words, there is preferably no step between the surface of that electrode and the surface of the third insulating layer. This enables formation of the light-emitting layer of the first display element on a stepless surface, eliminating the need for consideration of the step coverage at the time of forming the light-emitting layer and increasing productivity.

Here, a display device can, for example, have a structure in which a first display element, transistors, a second display element, and a third display element are sandwiched between a pair of substrates. Thus, a thin and extremely high-resolution display device can be obtained.

A more specific example is described below with reference to drawings.

Structure Example 1 of Display Device

Comparative Example

Figure 16:
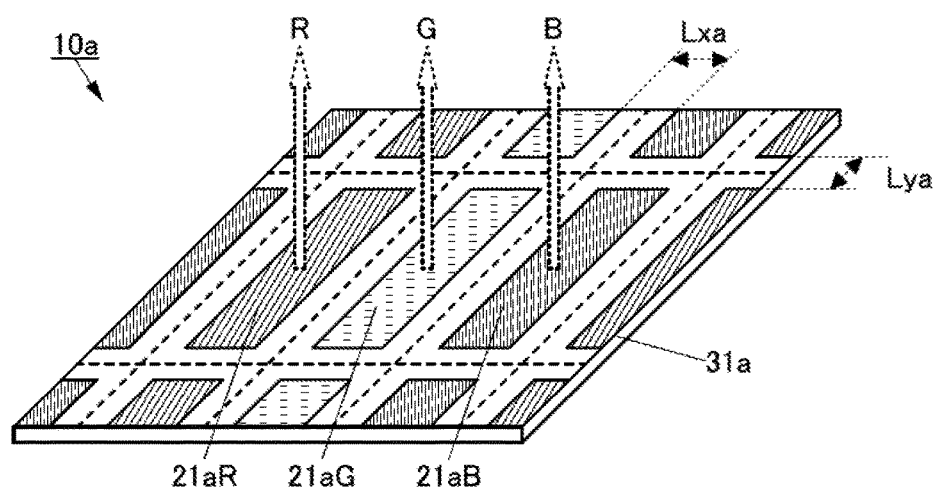
FIG. 16 illustrates a display device according to an embodiment.

First, a schematic perspective view of a display device 10a including a plurality of display elements on the same surface is illustrated in FIG. 16.

The display device 10a includes display elements 21aR, 21aG, and 21aB over an insulating layer 31a. The display elements 21aR, 21aG, and 21aB emit red light R, green light G, and blue light B, respectively, toward a display surface side.

A region surrounded by a broken line in FIG. 16 is a region that may be occupied by one subpixel. Although the region is rectangular here, the shape of the region is not limited to the rectangle as long as the shape can have a periodic arrangement.

The display elements 21aR, 21aG, and 21aB are arranged in a stripe pattern. Note that the display elements 21aR, 21aG, and 21aB have the same shape here.

As shown in FIG. 16, two display elements showing different colors are provided at an interval of a distance Lxa. Two display elements showing the same color are provided at an interval of a distance Lya.

The distances Lxa and Lya depend on design rules for formation of the display elements and a pixel circuit which are defined by the minimum feature size, alignment accuracy between different layers, and the like. By the improvement of performance of apparatus, exposure technique, and the like, the minimum feature size and design rules for formation of a pixel circuit can be reduced and tightened. This can accordingly reduce the distances Lxa and Lya.

However, it is difficult to simply reduce the distance Lxa between two display elements showing different colors for the following reasons.

When light-emitting elements are used as the display elements, light-emitting layers can be formed separately for the light-emitting elements showing different colors. In the case where an island-shaped pattern is formed using a deposition method such as an evaporation method using a shadow mask or an ink-jet method or the like, a part close to the outer edge may include a region that is different in thickness (a region with a small/large thickness). When the light-emitting layer is formed by such a method, the region that is different in thickness should not be positioned in a region contributing to light emission (a light-emitting region), and each island-shaped pattern needs to be larger than the light-emitting region by the width of the region that is different in thickness. For this reason, there is a limit to the reduction in the distance Lxa between two adjacent light-emitting elements.

Furthermore, when the distance Lxa is reduced simply, for example, mixing of colors between the display elements might occur. When the distance between two light-emitting elements which serve as display elements and emit different colors is reduced, undesired light emission might be generated due to a leakage current between these light-emitting elements. This might lead to a reduction in display quality, such as mixing of colors and a reduction in contrast.

Note that the distance Lxa might differ between the display elements 21aR, 21aG, and 21aB which differ in shape. Also in this case, the distance Lxa between the display elements needs to be longer than a predetermined value.

Structure Example

Figure 1B:
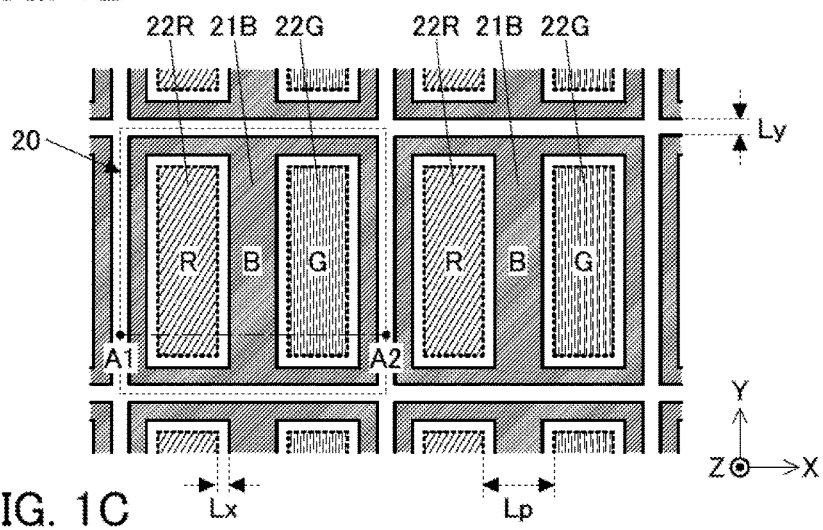

FIG. 1A is a schematic perspective view of a display device 10 of one embodiment of the present invention. FIG. 1B is a schematic view of the display device 10 when seen from the viewer side (display surface side, top surface side).

The display device 10 includes an insulating layer 32, a display element 21B, a display element 22R, and a display element 22G.

Of two surfaces of the insulating layer 32 which are perpendicular to the thickness direction of the insulating layer 32, one is positioned on the viewer side. The display element 21B is provided on the surface side (on the viewer side) of the insulating layer 32, and the display element 22R and the display element 22G are provided on the opposite surface side which is opposite from the viewer side.

A direction along which display elements showing different colors are arranged is referred to as X direction. A direction along which display elements showing the same color are arranged is referred to as Y direction. A thickness direction is referred to as Z direction.

Although a structure in which a display element showing one color is provided on one surface side of the insulating layer 32 and two kinds of display elements showing other colors are provided on the other surface side is described below for simplicity, four or more kinds of display elements may be included. For example, a display device may include a display element showing yellow (Y) or a display element showing white (W), in addition to the display elements showing red (R), green (G), and blue (B). In such a case, one of those display elements is provided on one surface side of the insulating layer 32 and the other display elements are provided on the other surface side of the insulating layer 32. Alternatively, two or more of those display elements are provided on one surface side of the insulating layer 32 and the other display elements are provided on the other surface side of the insulating layer 32.

In FIGS. 1A and 1B, the outline of display elements provided on the viewer side of the insulating layer 32 is drawn by a solid line, whereas the outline of display elements provided on the opposite side from the viewer side is drawn by a broken line.

Furthermore, in FIG. 1B, a region corresponding to one pixel 20 is surrounded by a broken line. The pixels 20 are arranged in a cyclic manner in X direction and Y direction. The pixels 20 each include the display element 21B, the display element 22R, and the display element 22G.

In the example here, the display element 21B includes two openings, and the display element 22R and the display element 22G are provided in regions overlapping with such openings. Light B emitted by the display element 21B is released to the viewer side. Furthermore, light R emitted by the display element 22R and light G emitted by the display element 22G are released to the viewer side through the insulating layer 32.

As illustrated in FIG. 1B, when seen from the above, part of the display element 21B is positioned between the display element 22R and the display element 22G. Thus, by arranging two display elements showing different colors on the same surface side of the insulating layer 32 so that the display elements are not adjacent to each other when seen from the above, the distance therebetween can be increased. Furthermore, when part of the display element provided on the opposite side from these two display elements is positioned between the two display elements with the insulating layer 32 therebetween, the area of a non-light-emitting region in the pixel can be reduced, increasing the aperture ratio.

Here, in this specification and the like, the aperture ratio refers to the area of a light-emitting region in a display region (effective light-emitting region or effective light-emitting area) or the proportion of the area of a light-emitting region in a display region (effective light-emitting area percent).

In FIG. 1B, a distance Lx, a distance Ly, and a distance Lp are shown. The distance Lx is a distance between two display elements showing different colors when seen from the display surface side. The distance Ly is a distance between two display elements showing the same color. The distance Lp is a distance between two display elements showing different colors and provided on one surface side of the insulating layer 32.

In the display device 10, the distance Lx can be reduced without constraints of minimum processing dimension because two display elements which are adjacent to each other when seen from the viewer side are provided on opposite sides of the insulating layer 32. In addition, the distance Lp between two adjacent display elements positioned on one surface side of the insulating layer 32 is larger enough than the minimum distance defined by minimum processing dimension and design rules; thus, problems such as mixing of colors do not occur therebetween. Since mixing of colors does not occur in principle between two display elements showing the same color and positioned on the other surface side of the insulating layer 32, the distance therebetween can be minimized within the constraints such as minimum processing dimension and design rules.

Furthermore, because the distance Lp can be large enough, a region with an uneven thickness of a light-emitting layer can be prevented from being formed in a light-emitting region even when light-emitting layers of the display elements are separately formed as described above. As a result, a display device with high resolution and high display quality can be provided.

For the above-described reasons, the distance between two adjacent display elements in the display device 10 when seen from the viewer side can be reduced as compared with the display device 10a illustrated in FIG. 16. Accordingly, the aperture ratio of the display device can be increased, or the resolution can be further increased with no reduction in aperture ratio.

Stacked Structure Example of Display Device

In a display device, each pixel (subpixel) preferably includes a selection transistor for controlling the state of a pixel (subpixel) (selected state or unselected state). Particularly when a light-emitting element is used as a display element, a driver transistor for controlling the amount of current flowing through the light-emitting element is preferably included in addition to the selection transistor.

Figure 1C:
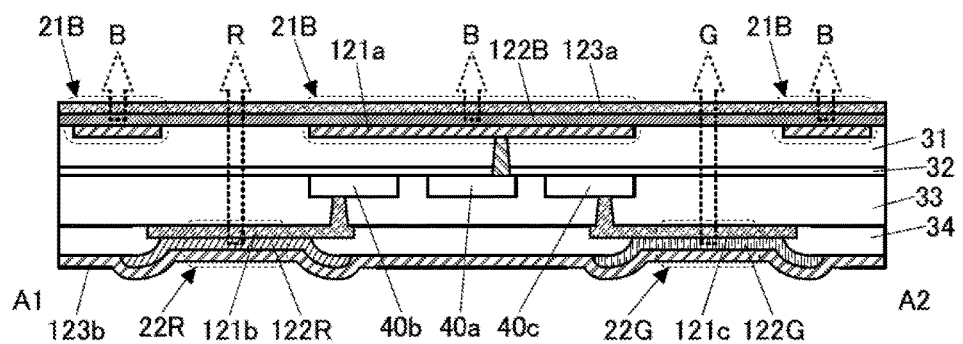

FIG. 1C is a schematic cross-sectional view of the display device 10 taken along a cutting plane line A1-A2 in FIG. 1B. Here, the viewer side (display surface side) is illustrated in the top direction.

The display device includes an insulating layer 31, the insulating layer 32, an insulating layer 33, the display element 21B, the display element 22R, the display element 22G, a transistor 40a, a transistor 40b, a transistor 40c, and the like.

The display element 21B includes a conductive layer 121a, an EL layer 122B, and a conductive layer 123a. The display element 22R includes a conductive layer 121b, an EL layer 122R, and a conductive layer 123b. The display element 22G includes a conductive layer 121c, an EL layer 122G, and the conductive layer 123b.

The insulating layer 31 is provided over the insulating layer 32, and the conductive layer 121a is provided over the insulating layer 31. Furthermore, the EL layer 122B and the conductive layer 123a are stacked over the conductive layer 121a and the insulating layer 32.

Here, as illustrated in FIG. 1C, a surface on the viewer side of the conductive layer 121a and a surface on the viewer side of the insulating layer 31 are positioned on the same plane. In other words, there is no step between the conductive layer 121a and the insulating layer 31.

Although there is preferably no step between the insulating layer 31 and the conductive layer 121a, a step might be generated depending on the manufacturing method. In such a case, steps at the level which does not cause a problem in formation of the EL layer 122B are acceptable. For example, a difference in height between the surface of the conductive layer 121a and the surface of the insulating layer 31 is smaller than the thickness of the EL layer 122B and, for example, a step of more than or equal to 0 nm and less than or equal to 500 nm, preferably less than or equal to 100 nm, further preferably less than or equal to 50 nm, still further preferably less than or equal to 20 nm may be included.

The insulating layer 33 is provided below the insulating layer 32, and the conductive layer 121b and the conductive layer 121c are provided below the insulating layer 33. Furthermore, an insulating layer 34 is provided below the insulating layer 33 so as to cover edges of each of the conductive layers 121b and 121c. Furthermore, the EL layer 122R and the EL layer 122G are provided to cover a surface of the conductive layer 121b and a surface of the conductive layer 121c, respectively. Moreover, the conductive layer 123b is provided so as to cover the EL layer 122R, the EL layer 122G, and the insulating layer 34.

The transistor 40a, the transistor 40b, and the transistor 40c are provided between the insulating layer 31 and the insulating layer 33. In an example illustrated in FIG. 1C, each of the transistors is provided between the insulating layer 32 and the insulating layer 33; however, the positional relation between the insulating layer 32 and each of the transistors is not limited to this example. For example, the insulating layer 32 may be an insulating layer having a surface on which the transistors are formed, or an insulating layer functioning as a protective layer covering the transistors. In particular, part of the insulating layer 32 preferably functions as an insulating layer included in the transistors (e.g., gate insulating layer).

The conductive layer 121a has a function of reflecting visible light, and the conductive layer 123a has a function of transmitting visible light. Accordingly, the display element 21B is a top-emission light-emitting element. The light B emitted by the display element 21B is released to the conductive layer 123a side, that is, the viewer side.

The conductive layer 121b and the conductive layer 121c have a function of transmitting visible light, and the conductive layer 123b has a function of reflecting visible light. Accordingly, the display element 22R and the display element 22R are bottom-emission light-emitting elements. The light R and the light G emitted by the display element 22R and the display element 22G travel to the conductive layer 121b side or the conductive layer 121c side and are released to the viewer side through the insulating layer 33, the insulating layer 32, and the insulating layer 31.

Here, the EL layer 122R and the EL layer 122G are layers including light-emitting materials showing different colors from each other. The EL layer 122R and the EL layer 122G are each formed in an island shape. With this structure, the EL layer 122R and the EL layer 122G can be individually optimized. Thus, the light R and the light G emitted by the display element 22R and the display element 22G can each be light with increased color purity.

The transistor 40a, the transistor 40b, and the transistor 40c are electrically connected to the display element 21B, the display element 22R, and the display element 22G, respectively, and function as driver transistors.

The transistor 40a and the conductive layer 121a are electrically connected to each other through an opening provided in the insulating layer 31 (or the insulating layer 31 and the insulating layer 32). The transistor 40b and the conductive layer 121b are electrically connected to each other through an opening provided in the insulating layer 33, and the transistor 40c and the conductive layer 121c are electrically connected to each other through an opening provided in the insulating layer 33.

As illustrated in FIG. 1C, the transistor 40a, the transistor 40b, and the transistor 40c are arranged side by side on the same plane. Thus, the transistors can be formed at the same time through the same process, reducing manufacturing cost.

Furthermore, as illustrated in FIG. 1C, the conductive layer 121a is preferably provided so as to overlap with the transistor 40a, the transistor 40b, and the transistor 40c. Thus, the light-emitting region of the display element 21B can be increased.

Figure 2:
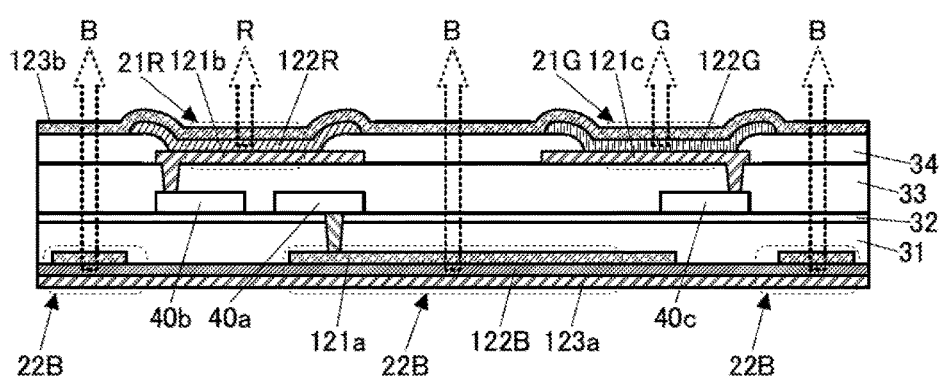
FIG. 2 illustrates a display device according to an embodiment.

FIG. 2 illustrates a cross-sectional structure example different from that illustrated in FIG. 1C. The structure illustrated in FIG. 2 is obtained by roughly turning upside down the structure illustrated in FIG. 1C except that the structure of the display elements and the position of the transistors are different. In FIG. 2, a display element 21R and a display element 21G are provided on the viewer side (display surface side), and a display element 22B is provided on the opposite side from the viewer side.

The conductive layer 121b included in the display element 21R and the conductive layer 121c included in the display element 21G each have a function of reflecting visible light. Furthermore, the conductive layer 123b has a function of transmitting visible light. Accordingly, the display element 21R and the display element 21G are top-emission light-emitting elements.

Meanwhile, in the display element 22B, the conductive layer 121a has a function of transmitting visible light, and the conductive layer 123a has a function of reflecting visible light. Accordingly, the display element 22B is a bottom-emission light-emitting element.

Furthermore, as illustrated in FIG. 2, the transistor 40b and the transistor 40c are preferably provided so as to overlap with the conductive layer 121b and the conductive layer 121c, respectively. Moreover, the transistor 40a is preferably provided so as to overlap with the conductive layer 121b or the conductive layer 121c.

[Pixel Arrangement]

Another example of pixel arrangement which is different from the example illustrated in FIG. 1B and the like is described below.

Figure 3A:
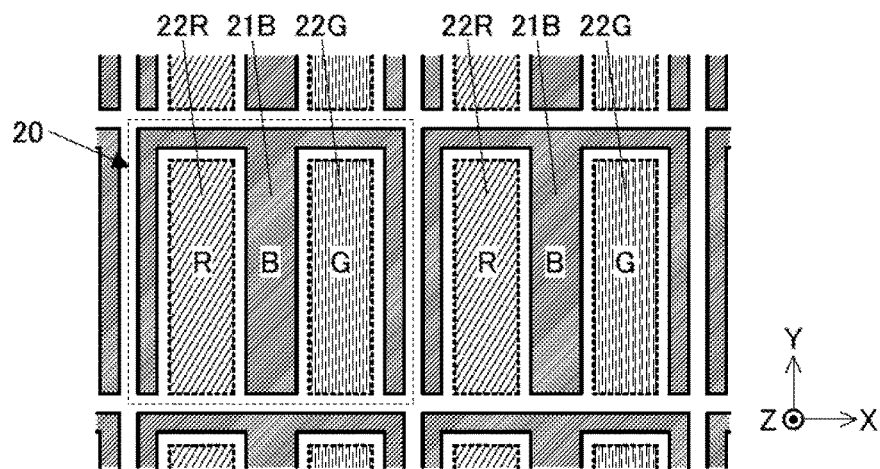
FIGS. 3A to 3C each illustrate a display device according to an embodiment.

FIG. 3A illustrates an example in which the display element 21B has a comb-like shape when seen from the above. This structure can increase the area of the display element 22R and the display element 22G as compared with the structures illustrated in FIG. 1B and the like.

Figure 3B:
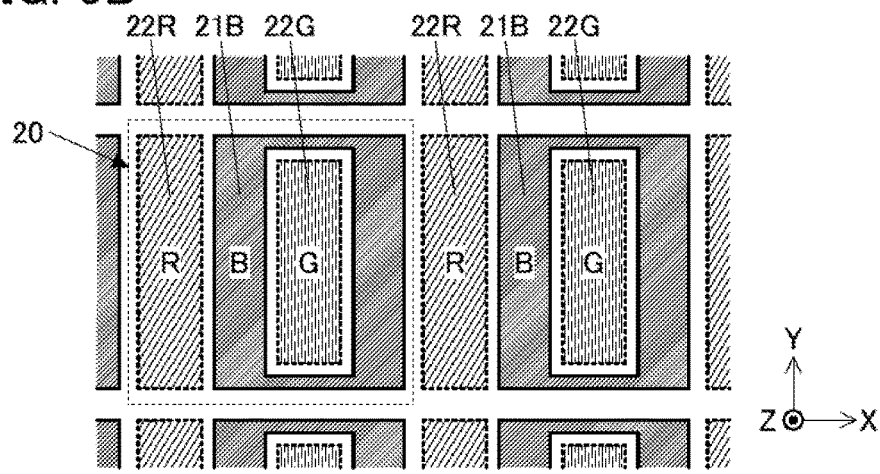

FIG. 3B illustrates an example in which the display element 21B has one opening with which the display element 22G overlaps. The display element 22R which is not surrounded by the one display element 21B is longer in Y direction than the display element 22G.

Figure 3C:
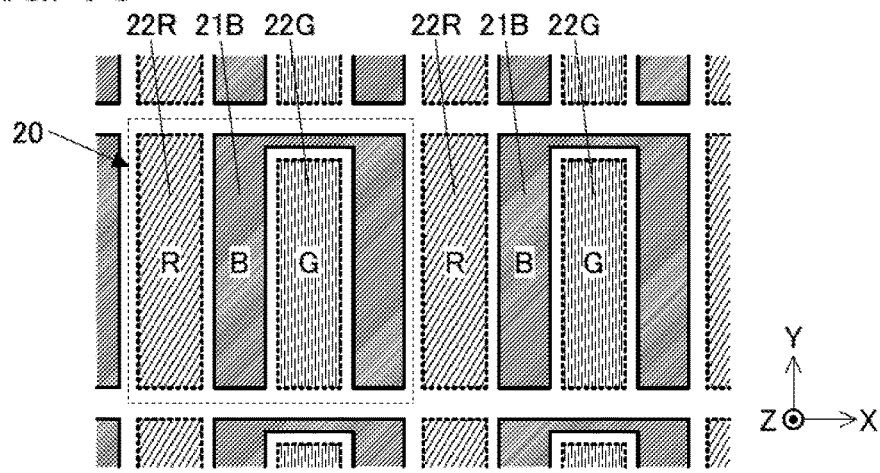

FIG. 3C illustrates an example in which the display element 21B illustrated in FIG. 3B is changed to have a comb-like shape when seen from the above.

The structures described above in which at least part of the display element 21B positioned on the opposite surface side is provided between the display element 22R and the display element 22G positioned on the one surface side and showing different colors can increase the distance between the display element 22R and the display element 22G.

Figure 4A:
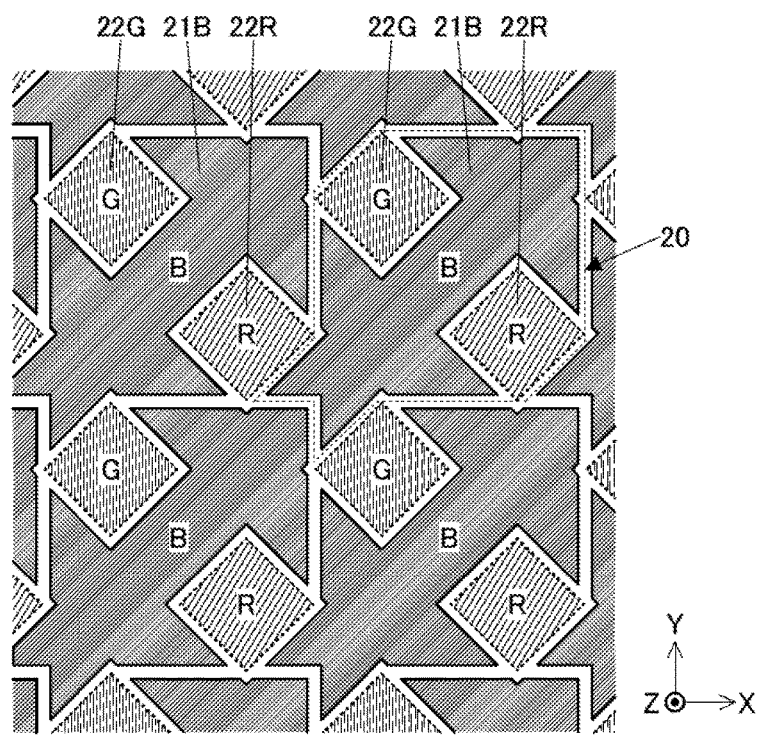
FIGS. 4A and 4B each illustrate a display device according to an embodiment.
Figure 4B:
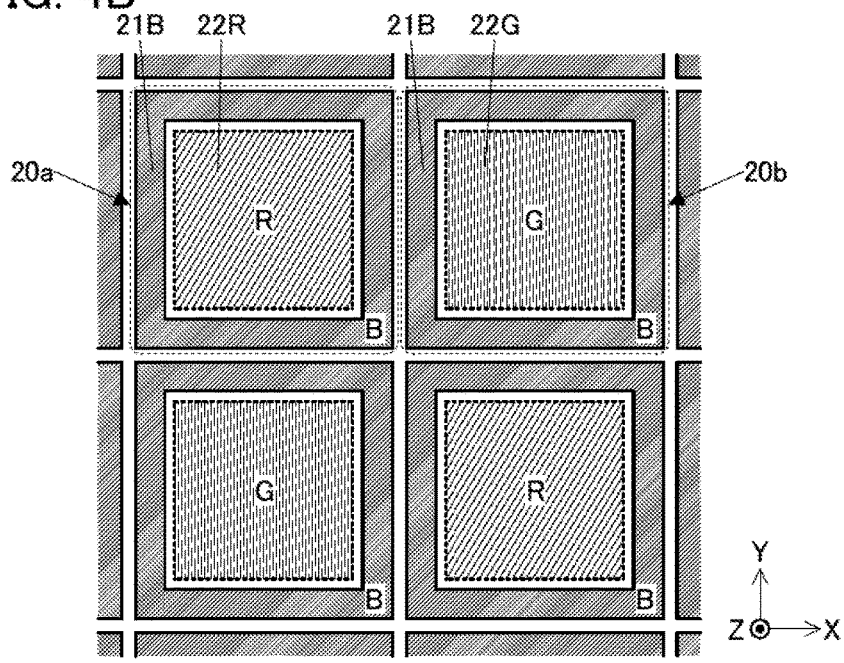

FIGS. 4A and 4B illustrate examples of display element arrangement which are different from the stripe arrangement illustrated in FIG. 1B and FIGS. 3A to 3C.

In FIG. 4A, the pixels 20 are arranged in directions parallel to X direction and Y direction. Furthermore, the pixels 20 each include the display element 21B, the display element 22R, and the display element 22G.

The display element 22R alternates with the display element 22G in directions inclined substantially 45 degrees to X and Y directions. Furthermore, facing sides of the display element 22R and the display element 22G are inclined substantially 45 degrees to X and Y directions. With this arrangement, the distance between two display elements positioned on the same surface side and showing different colors can be increased.

In FIG. 4A, the display element 22R and the display element 22G have a square shape which is inclined 45 degrees to X direction (and Y direction). Note that the top surface shape of the display element 22R and the display element 22G is not limited to the above-described example and can be selected from various shapes such as a rectangle, a rhombus, a parallelogram, a polygon, a circle, an ellipse, and a rectangle with rounded corners.

FIG. 4B illustrates an example including two kinds of pixels which are a pixel 20a including the display element 21B and the display element 22R and a pixel 20b including the display element 21B and the display element 22G.

In the pixel 20a, the display element 22R is positioned inside an opening of the display element 21B. In the pixel 20b, the display element 22G is positioned inside an opening of the display element 21B.

Furthermore, the pixel 20a alternates with the pixel 20b in X direction and Y direction.

With this structure, a higher resolution can be achieved as compared with the case where three kinds of display elements are included in one pixel.

Note that the arrangement order of display elements is not limited to those in FIG. 1B, FIGS. 3A to 3C, and FIGS. 4A and 4B, and the display elements can be replaced with each other. Furthermore, the display elements positioned on the display surface side (e.g., the display element 21R, the display element 21G, and the display element 21B) and the display elements positioned on the opposite side from the display surface side (e.g., the display element 22R, the display element 22G, the display element 22B) can be replaced with each other. In addition, the shape and area of the display elements are not limited to those shown in the drawings.

The above is the description of the pixel arrangement.

Structure Example 2 of Display Device

A more specific structure example of the display device of one embodiment of the present invention is described below with reference to drawings.

[Display Device]

Figure 5:
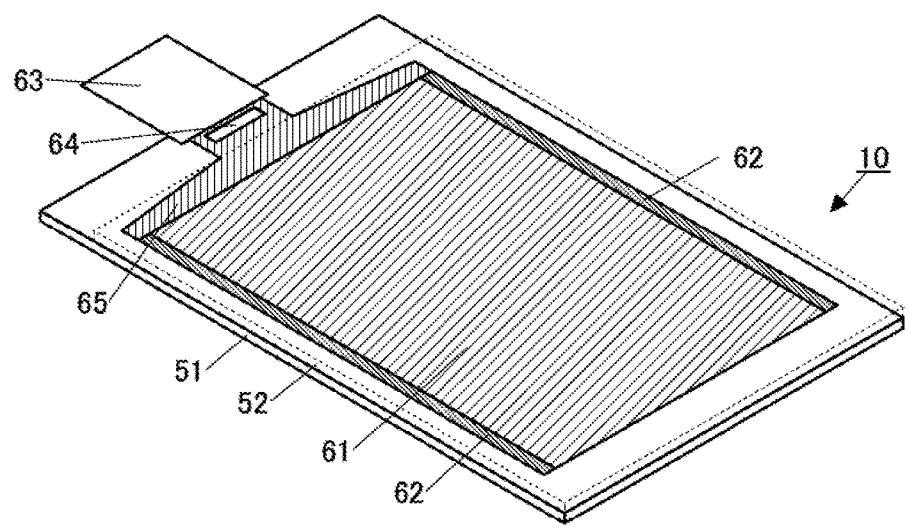
FIG. 5 illustrates a display device according to an embodiment.

FIG. 5 is a perspective view of the display device 10. The display device 10 includes a substrate 51 and a substrate 52. The substrate 52 is shown by a broken line in FIG. 5.

The display device 10 includes a display portion 61, a circuit portion 62, a wiring 65, and the like between the substrates 51 and 52. In FIG. 5, an IC 64 and an FPC 63 are mounted on the substrate 51. Therefore, the display device 10 illustrated in FIG. 5 can be referred to as a display module.

As the circuit portion 62, a circuit functioning as a scan line driver circuit can be used, for example.

The wiring 65 has a function of supplying a signal and electric power to the display portion 61 or the circuit portion 62. The signal and electric power are input from outside through the FPC 63 or from the IC 64.

In the example of FIG. 5, the IC 64 is mounted on the substrate 51 by a chip on glass (COG) method or the like. As the IC 64, an IC serving as a scan line driver circuit, a signal line driver circuit, or the like can be used, for example. Note that the IC 64 is not necessarily provided if not needed. The IC 64 may be mounted on the FPC 63 by a chip on film (COP) method or the like.

Cross-Sectional Structure Example 1

Figure 6:
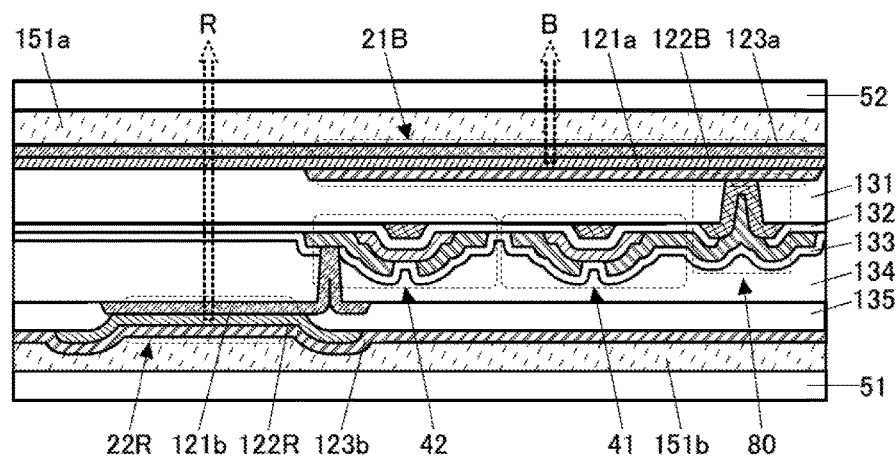
FIG. 6 illustrates a display device according to an embodiment.

FIG. 6 is a schematic cross-sectional view of a display portion of the display device 10. Here, a cross section of a region including two display elements (the display element 21B and the display element 22R) is illustrated.

The display device 10 includes a transistor 41, a transistor 42, a connection portion 80, the display element 21B, the display element 22R, an adhesive layer 151a, an adhesive layer 151b, and the like between the substrate 51 and the substrate 52. Furthermore, the display device 10 includes an insulating layer 131, an insulating layer 132, an insulating layer 133, an insulating layer 134, an insulating layer 135, and the like.

The display element 21B is positioned on the substrate 52 side of the insulating layer 132, and the display element 22R is positioned on the substrate 51 side of the insulating layer 132. The light B emitted by the display element 21B is released to the outside through the adhesive layer 151a and the substrate 52. The light R emitted by the display element 22R is released to the outside through the insulating layer 132, the adhesive layer 151a, the substrate 52, and the like.

The transistor 41 and the transistor 42 are provided on a surface on the substrate 51 side of the insulating layer 131. The insulating layer 132 partly functions as a gate insulating layer of the transistors 41 and 42. The insulating layer 133 covers the transistors 41 and 42 and functions as a protective layer. The insulating layer 134 covers the insulating layer 133 and functions as a planarization layer.

A surface on the substrate 51 side of the insulating layer 134 is provided with the conductive layer 121b, and the insulating layer 135 is provided to cover an edge of the conductive layer 121b. The EL layer 122R is formed in an island shape so as to cover part of the conductive layer 121b and part of the insulating layer 135. The conductive layer 123b is provided to cover the insulating layer 135 and the EL layer 122R. The conductive layer 121b is electrically connected to one of a source electrode and a drain electrode of the transistor 42 through an opening provided in the insulating layers 134 and 133.

The conductive layer 121a is provided on a surface on the substrate 52 side of the insulating layer 131. Furthermore, the EL layer 122B and the conductive layer 123a are stacked so as to cover the conductive layer 121a and the insulating layer 131.

As illustrated in FIG. 6, the surface on the substrate 52 side of the insulating layer 131 and a surface on the substrate 52 side of the conductive layer 121a are preferably positioned on the same plane. That is, there is preferably no or an extremely small step between the surface on the substrate 52 side of the conductive layer 121a and the surface on the substrate 52 side of the insulating layer 131.

Here, the connection portion 80 has a function of electrically connecting the conductive layers provided on the both surfaces of the insulating layer 131. The connection portion 80 illustrated here includes an opening provided in the insulating layer 131, a conductive layer positioned in the opening and provided by processing the same conductive layer that is used for a gate electrode of the transistor 41 or the like. One of a source electrode and a drain electrode of the transistor 41 is electrically connected to the conductive layer 121a through the connection portion 80.

Manufacturing Method Example 1

A manufacturing method example of the display device illustrated in FIG. 6 is described below.

Note that thin films included in the display device (e.g., insulating films, semiconductor films, or conductive films) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced CVD (PECVD) method or a thermal CVD method may be used. As the thermal CVD method, for example, a metal organic CVD (MOCVD) method may be used.

Alternatively, thin films included in the display device (e.g., insulating films, semiconductor films, or conductive films) can be formed by a method such as spin coating, dipping, spray coating, ink-jetting, dispensing, screen printing, or offset printing, or with a doctor knife, a slit coater, a roll coater, a curtain coater, or a knife coater.

When thin films included in the display device are processed, a photolithography method or the like can be used for the processing. Alternatively, island-shaped thin films may be formed by a film formation method using a blocking mask. A nanoimprinting method, a sandblasting method, a lift-off method, or the like may be used for the processing of thin films. Examples of a photolithography method include a method in which a resist mask is formed over a thin film to be processed, the thin film is processed by etching or the like, and the resist mask is removed, and a method in which a photosensitive thin film is formed and exposed to light and developed to be processed into a desired shape.

In the photolithography method, any of an i-line (light with a wavelength of 365 nm), a g-line (light with a wavelength of 436 nm), and an h-line (light with a wavelength of 405 nm), or combined light of any of them can be used for exposure. Alternatively, ultraviolet light, KrF laser light, ArF laser light, or the like can be used. Exposure may be performed by liquid immersion exposure technique. As the light for the exposure, extreme ultra-violet (EUV) light or X-rays may be used. Instead of the light for the exposure, an electron beam can be used. It is preferable to use EUV, X-rays, or an electron beam because extremely minute processing can be performed. Note that in the case of performing exposure by scanning of a beam such as an electron beam, a photomask is not needed.

For etching of thin films, a dry etching method, a wet etching method, a sandblast method, or the like can be used.

First, a support substrate 55 is prepared. As the support substrate 55, a substrate having rigidity high enough to be easily transferred in an apparatus or between apparatuses can be used. In addition, a substrate which is resistant to heat in the manufacturing process is used. For example, a glass substrate with a thickness larger than or equal to 0.3 mm and smaller than or equal to 1 mm can be used.

Figure 7A:
FIGS. 7A to 7F illustrate a method for manufacturing a display device according to an embodiment.

Next, a separation layer 56 is formed over the support substrate 55 (FIG. 7A).

As the separation layer 56, a material which causes separation at an interface between the separation layer 56 and a layer provided thereover, in the separation layer 56, or at an interface between the separation layer 56 and the support substrate 55 can be used.

For example, a stack of a layer containing a high-melting-point metal material such as tungsten or molybdenum and a layer containing an oxide of the metal material can be used as the separation layer 56. Over such layers, an insulating layer containing an inorganic insulating material such as silicon nitride, silicon oxide, silicon oxynitride, or silicon nitride oxide may be stacked and then used as the separation layer. Note that in this specification, oxynitride contains more oxygen than nitrogen, and nitride oxide contains more nitrogen than oxygen. A high-melting-point metal material is preferably used in the separation layer 56 because in the process after that, treatment at high temperature can be performed and there are more materials and formation methods to choose from.

When a stack of a tungsten layer and a tungsten oxide layer is used as the separation layer 56, separation can be performed at an interface between the tungsten layer and the tungsten oxide layer or in the tungsten oxide layer. When a stack of a tungsten layer, a tungsten oxide layer, and an insulating layer is used as the separation layer 56, separation can be performed at an interface between the tungsten layer and the tungsten oxide layer, in the tungsten oxide layer, or at an interface between the tungsten oxide layer and the insulating layer. Note that in the case where tungsten oxide or the insulating layer remains after the separation, it is preferably removed.

Furthermore, an organic resin material such as polyimide can be used in the separation layer 56. In particular, a polyimide resin is preferable because of its high heat resistance and low thermal expansion coefficient. Other examples of the organic resin material include an acrylic resin, an epoxy resin, a polyamide resin, a polyimide-amide resin, a siloxane resin, a benzocyclobutene-based resin, and a phenol resin.

Using a photosensitive organic resin material in the separation layer 56 is preferable because part of the resin material can be removed by a photolithography technique, for example. The thickness of the separation layer 56 is more than or equal to 0.01 µm and less than or equal to 200 µm, preferably more than or equal to 0.1 µm and less than or equal to 50 µm, further preferably more than or equal to 0.1 µm and less than or equal to 20 µm, still further preferably more than or equal to 0.1 µm and less than or equal to 10 µm for easy processing.

In the case where an organic resin material is used in the separation layer 56, separation can occur at an interface between the support substrate 55 and the separation layer 56, in the separation layer 56, or at an interface between the separation layer 56 and a layer provided thereover.

In the case where an organic resin material is used in the separation layer 56, separability is sometimes increased by heat treatment with a laser, a flash lamp, or the like. In such a case, by performing this heat treatment right before the separation step, unintentional separation before the heat treatment step can be prevented. Moreover, in the case where separation occurs without such heat treatment, a special apparatus for the heat treatment is unnecessary and manufacturing cost can be reduced.

In the case where part of the separation layer 56 remains after separation, at least part of the remaining layer is preferably removed. In the case where an organic resin material is used in the separation layer 56, a wet etching method, plasma treatment in an atmosphere containing oxygen (ashing treatment), or the like can be used for the removal.

Figure 7B:
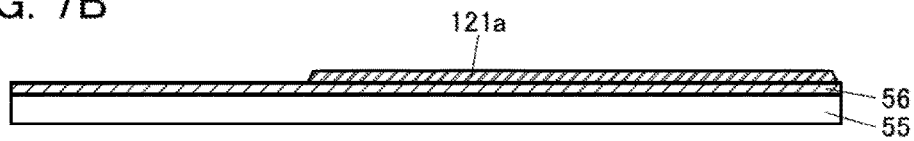

Then, the conductive layer 121*a* is formed over the separation layer 56 (FIG. 7B). The conductive layer 121*a* can be formed in the following manner: a conductive film is formed, a resist mask is formed, the conductive film is etched, and the resist mask is removed.

Figure 7C:
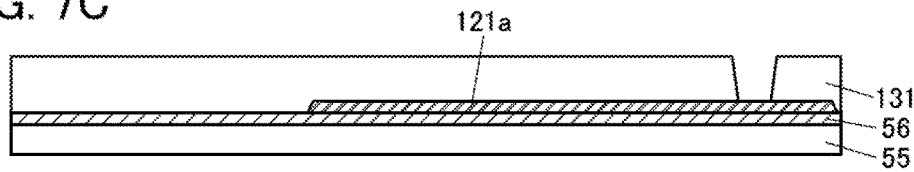

Next, the insulating layer 131 is formed over the conductive layer 121*a* and the separation layer 56. After that, an opening that reaches the conductive layer 121*a* is formed in the insulating layer 131 (FIG. 7C).

Figure 7D:
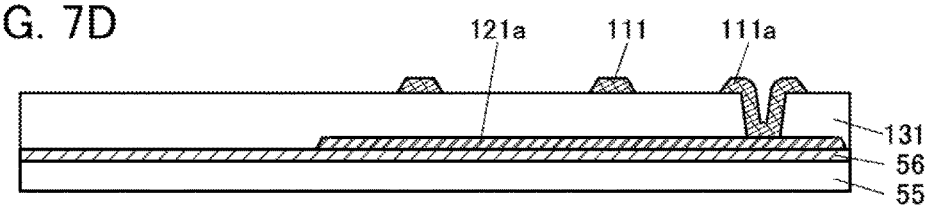

Then, a conductive layer 111 and a conductive layer 111*a* are formed over the insulating layer 131 (FIG. 7D). First, a conductive film is formed over the insulating layer 131 and in the opening of the insulating layer 131 and then processed by a photolithography technique or the like; thus, the conductive layer 111 and the conductive layer 111*a* can be formed. Part of the conductive layer 111 functions as a gate electrode of a transistor. Furthermore, the conductive layer 111*a* is electrically connected to the conductive layer 121*a* and constitutes part of the connection portion 80.

Figure 7E:
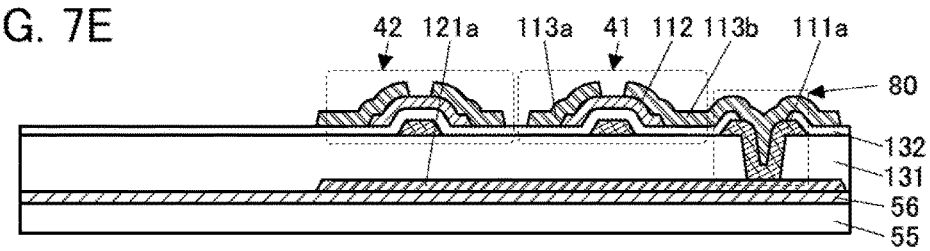

Then, the transistor 41 and the transistor 42 are formed (FIG. 7E).

First, the insulating layer 132 is formed to cover the insulating layer 131, the conductive layer 111, the conductive layer 111*a*, and the like. Part of the insulating layer 132 functions as a gate insulating layer. Then, part of the insulating layer 132 which overlaps with the conductive layer 111*a* is removed by etching with a photolithography technique or the like.

Next, a semiconductor layer 112 is formed over the insulating layer 132. The semiconductor layer 112 can be formed in the following manner: a semiconductor film is formed, a resist mask is formed, the semiconductor film is etched, and the resist mask is removed.

As the semiconductor layer 112, a metal oxide is particularly preferably used. Typically, an oxide semiconductor deposited by a sputtering method can be used.

Then, a conductive layer 113*a* and a conductive layer 113*b* are formed. The conductive layer 113*a* and the conductive layer 113*b* can be formed by a method similar to that of the conductive layer 111 or the like.

Here, the connection portion 80 can be formed at the same time.

In the case of using a metal oxide (or an oxide semiconductor) as the semiconductor layer 112, portions in contact with the conductive layer 113*a* and the conductive layer 113*b* and regions in the vicinity of the portions can be decreased in resistance. In other words, the semiconductor layer 112 can include a high-resistance region where a channel is formed and low-resistance regions functioning as a source and a drain. This can reduce the contact resistance between the conductive layer 113*a* and the semiconductor layer 112 and between the conductive layer 113*b* and the semiconductor layer 112, allowing an increase of a current flowing through the transistor in an on state.

Then, the insulating layer 133 and the insulating layer 134 are formed to cover the transistor 41, the transistor 42, and the connection portion 80.

As the insulating layer 133, an inorganic insulating film including oxygen is preferably used. A stack formed by providing an inorganic insulating film including nitrogen over an inorganic insulating film including oxygen is preferably used as the insulating layer 133.

An inorganic insulating film or an organic insulating film can be used as the insulating layer 134. When a photosensitive material is used as the insulating layer 134, an opening can be formed by a photolithography technique or the like. Note that an opening may be formed by a photolithography technique or the like after the insulating layer 134 is formed. An organic insulating film is particularly preferable as the insulating layer 134 because the layer can have a flat surface.

In or after the formation of the insulating layer 133 and the insulating layer 134, an opening that reaches the conductive layer 113*a* of the transistor 42 is formed.

Then, the conductive layer 121*b* is formed over the insulating layer 134. The conductive layer 121*b* can be formed in the following manner: a conductive film is formed to cover the insulating layer 134 and the opening of the insulating layer 134 and processed by a photolithography technique or the like, for example.

Figure 7F:
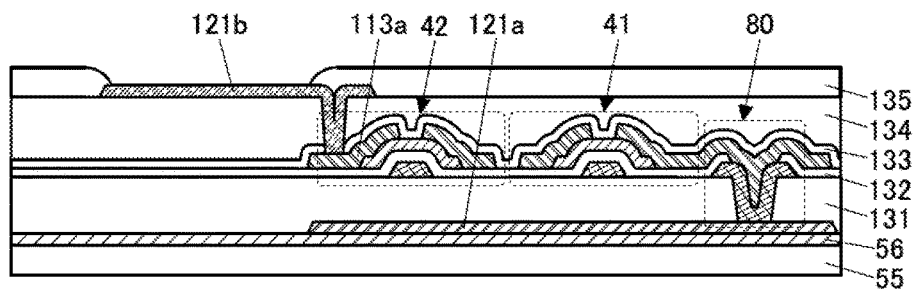

Next, the insulating layer 135 which covers an edge of the conductive layer 121*b* is formed (FIG. 7F). The insulating layer 135 can be formed by a method similar to that of the insulating layer 134.

Then, the EL layer 122R and the EL layer 122G (not shown) are formed. The EL layer 122R and the EL layer 122G can be formed by a vacuum evaporation method using a metal mask or the like or an ink-jet method, for example.

Note that the EL layer 122R and the EL layer 122G may each be formed by forming a thin film and processing the thin film into an island shape by a photolithography technique or the like.

Figure 8A:
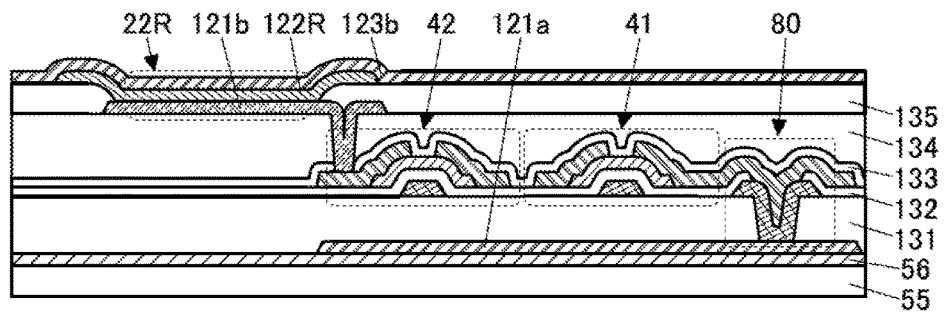
FIGS. 8A to 8C illustrate a method for manufacturing a display device according to an embodiment.

Then, the conductive layer 123*b* is formed to cover the EL layer 122R and the EL layer 122G (not shown) (FIG. 8A). The conductive layer 123*b* can be formed by a vacuum evaporation method or a sputtering method, for example.

A barrier layer may be formed over the conductive layer 123*b*. As the barrier layer, an inorganic insulating film, an organic insulating film, or a stack of these films can be used. By using the barrier layer having a stacked-layer structure, a barrier property can be increased. The inorganic insulating film is preferably formed by a film formation method capable of forming a dense film at a low temperature such as a sputtering method or an ALD method.

Then, using the adhesive layer 151*b*, the substrate 51 is attached. After that, the adhesive layer 151*b* is cured. As the adhesive layer 151*b*, a curable adhesive is preferably used. Furthermore, a material into which impurities such as water is unlikely to diffuse is preferably used as the adhesive layer 151*b*.

Figure 8B:
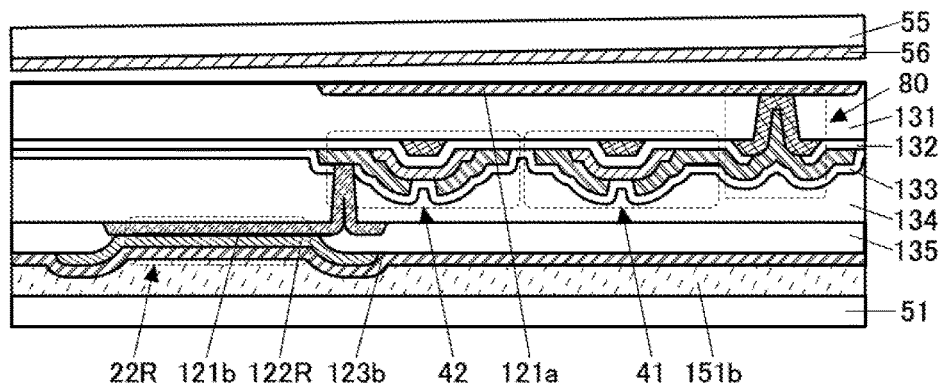

Then, separation is caused between the insulating layer 131 and the separation layer 56 and between the conductive layer 121*a* and the separation layer 56, so that the support substrate 55 and the separation layer 56 are removed (FIG. 8B).

As a separation method, applying mechanical force, etching the separation layer, and making a liquid permeate the separation interface by dripping the liquid or soaking in the liquid are given as examples. Alternatively, separation may be performed by heating or cooling two layers of the separation interface by utilizing a difference in thermal expansion coefficient between the two layers.

Furthermore, heat treatment may be performed for increased separability. The heat treatment can be performed anytime after the formation of the insulating layer 131 but is preferably performed immediately before the separation. When a method capable of heating momentarily and locally, such as laser annealing or lamp annealing, is used as the heat treatment, thermal degradation of the display element 22R and the display element 22G (not shown) can be suppressed.

In addition, treatment for exposing part of the separation interface may be performed before the separation. For example, with a laser, a sharp tool, or the like, part of the insulating layer 131 on the separation layer 56 is removed. This can start or trigger the separation from the portion where the insulating layer 131 is removed.

In some cases, part of the separation layer 56 remains after the separation. In such a case, the remaining separation layer 56 is preferably removed by cleaning, etching, plasma treatment, wiping treatment, or the like. In particular, the separation layer 56 positioned on the conductive layer 121*a* is preferably removed.

Figure 8C:
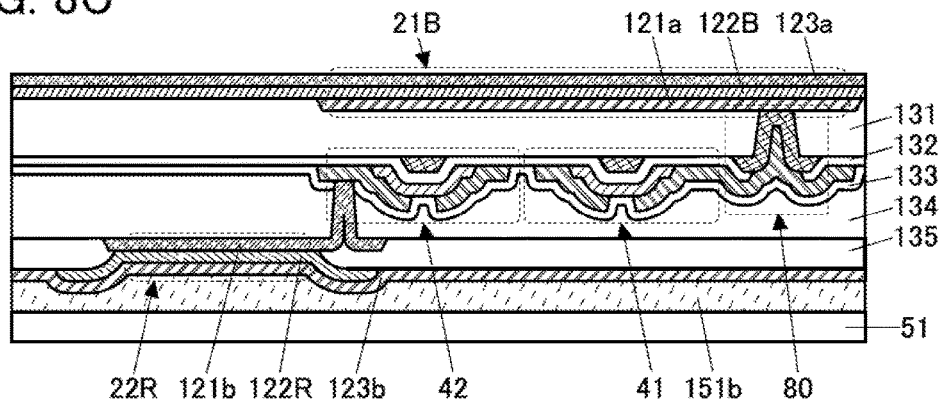

Then, the EL layer 122B and the conductive layer 123*a* are formed over the conductive layer 121*a* and the insulating layer 131. Thus, the display element 21B is formed (FIG. 8C).

The EL layer 122B can be formed by a vacuum evaporation method without a shadow mask such as a metal mask, for example. Note that a shadow mask for shielding a peripheral region may be used so as not to form the EL layer 122B in an area other than the display region.

The conductive layer 123*a* can be formed by a method similar to that used for the conductive layer 123*b*.

Then, the substrate 52 is attached using the adhesive layer 151*a*. After that, the adhesive layer 151*a* is cured. As the adhesive layer 151*a*, a curable adhesive is preferably used. Furthermore, a material into which impurities such as water is unlikely to diffuse is preferably used as the adhesive layer 151*a*.

Through the above steps, the display device in FIG. 6 can be manufactured.

Because the methods described here use the adhesive layers to attach the substrate 51 and the substrate 52, these substrates need not have high heat resistance. Accordingly, various materials can be used as the substrate 51 and the substrate 52. For example, a material through which impurities such as water does not permeate easily (typically, glass) can be used as the substrate 51 and the substrate 52. For example, when a material having flexibility is used for the substrate 51 and the substrate 52, a bendable display device can be achieved. Note that the substrate 51 and the substrate 52 each have a function of protecting display elements, transistors, and the like and can be referred to as protective layers.

The above is the description of the manufacturing method example.

Modification Example 1

Figure 9:
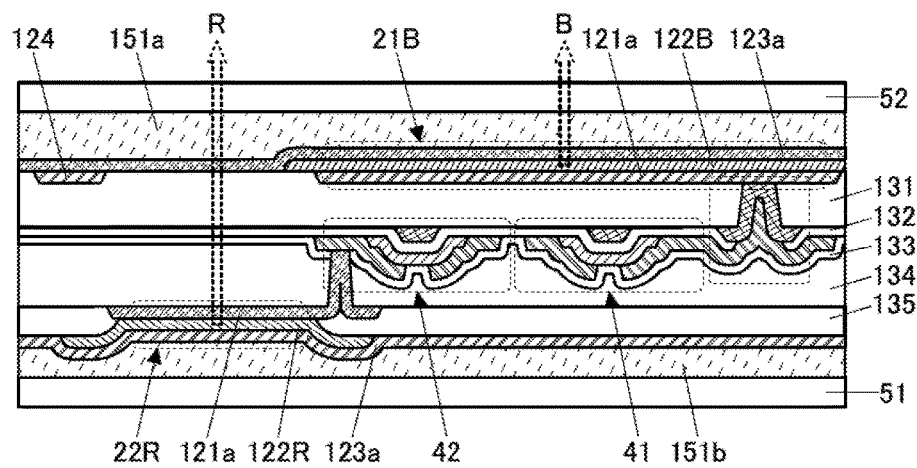
FIG. 9 illustrates a display device according to an embodiment.

FIG. 9 illustrates an example of a cross-sectional structure of a display device having a structure partly different from that illustrated in FIG. 6. The display device illustrated in FIG. 9 includes a conductive layer 124.

The EL layer 122B included in the display element 21B positioned on the display surface side is evenly formed in FIG. 6, while part of the EL layer 122B is removed in FIG. 9. The EL layer 122B is provided in a region where the conductive layer 121*a* is provided. The EL layer 122B may be in an island shape or may be provided with an opening.

The conductive layer 124 is provided in a region where the EL layer 122B is not provided. The conductive layer 124 is formed from the same conductive film that is used for forming the conductive layer 121*a*. The conductive layer 123*a* is provided over and in contact with the conductive layer 124 and they are electrically connected to each other.

The conductive layer 124 functions as an auxiliary wiring for supplementing the conductivity of the conductive layer 123a. For example, in the case where an oxide conductive film having higher electric resistance than a metal is used as the conductive layer 123a, the luminance of the light B emitted by the display element 21B might vary in the display region by the influence of a resistance component of the conductive layer 123a. In particular, this variation is significant when the display region has a large area. Provision of the conductive layer 124 can reduce the variations in luminance.

Furthermore, by using the conductive layer 124, a conductive material with an extremely high light-transmitting property can be used as the conductive layer 123a. Accordingly, part of the light R (or the light G) from the display element 22R (or the display element 22G) becomes difficult to be absorbed by the conductive layer 123a, increasing light extraction efficiency.

The above is the description of the modification example.

Cross-Sectional Structure Example 2

Figure 10:
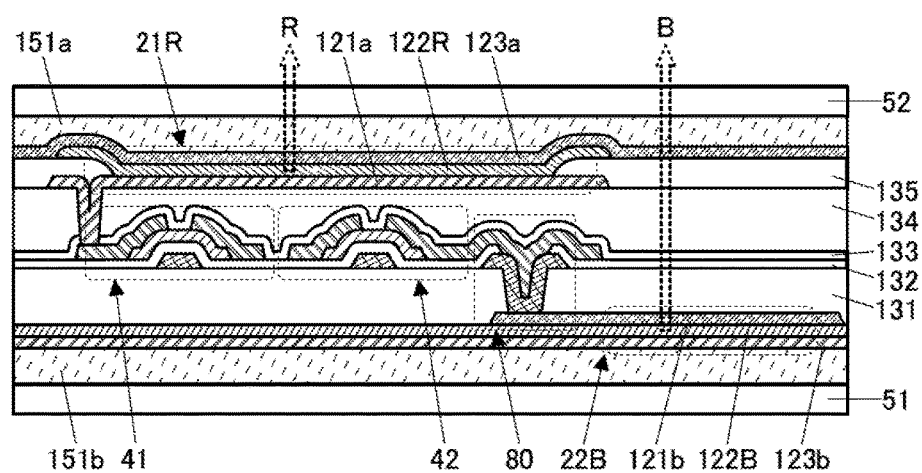
FIG. 10 illustrates a display device according to an embodiment.

FIG. 10 illustrates an example of a cross-sectional structure which is different from that illustrated in FIG. 6. The structure of a display device illustrated in FIG. 10 is obtained by roughly turning upside down the structure illustrated in FIG. 6.

The structure illustrated in FIG. 10 is provided with the display element 21R and the display element 21G (not shown) on the display surface side (the substrate 52 side) above the insulating layer 132, and is provided with the display element 22B on the side opposite from the display surface side below the insulating layer 132. The display element 21R and the display element 21G are each a top-emission light-emitting element, and the display element 22B is a bottom-emission light-emitting element.

The conductive layer 121a of the display element 21R is electrically connected to one of a source and a drain of the transistor 41 through an opening provided in the insulating layer 134. Furthermore, the insulating layer 135 is provided to cover an edge of the conductive layer 121a, the EL layer 122R in an island shape is provided over the conductive layer 121a, and the conductive layer 123a is provided over the EL layer 122R.

The conductive layer 121b of the display element 22B is electrically connected to one of a source and a drain of the transistor 42 through the connection portion 80. Furthermore, the EL layer 122B and the conductive layer 123b are stacked so as to cover a surface on the substrate 51 side of the conductive layer 121b.

As the conductive layer 121a and the conductive layer 123b, conductive films which reflect visible light can be used. Furthermore, as the conductive layer 123a and the conductive layer 121b, conductive films which transmit visible light can be used.

The above is the description of the cross-sectional structure example 2.

[Light-Emitting Element]

Structure examples of a light-emitting element that can be used as the display element included in the display device of one embodiment of the present invention are described below.

Structure Example 1

Figure 11A:
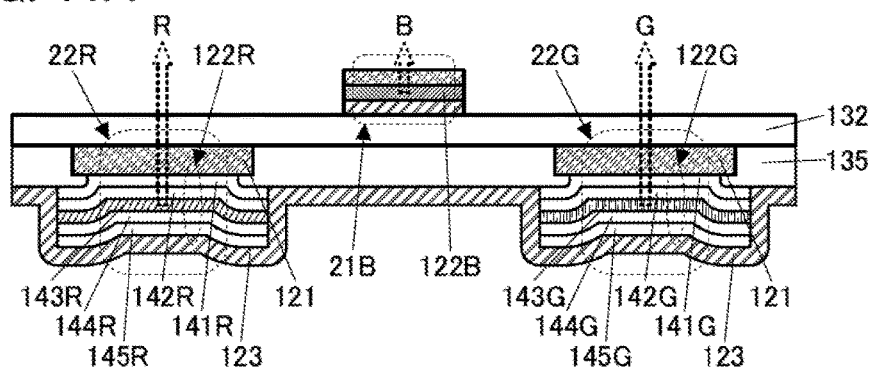
FIGS. 11A to 11D each illustrate a display device according to an embodiment.

FIG. 11A illustrates an example in which the top-emission display element 21B is provided on the top side (display surface side) of the insulating layer 132 and the bottom-emission display element 22R and the bottom-emission display element 22G are provided on the bottom side.

The display element 22R includes the EL layer 122R between a conductive layer 121 and a conductive layer 123. In FIG. 11A, the EL layer 122R includes, from the conductive layer 121 side, a carrier-injection layer 141R, a carrier-transport layer 142R, a light-emitting layer 143R, a carrier-transport layer 144R, and a carrier-injection layer 145R.

For example, when the conductive layer 121 and the conductive layer 123 serve as an anode and a cathode, respectively, a material having a high hole-injection property is used for the carrier-injection layer 141R, a material having a high hole-transport property is used for the carrier-transport layer 142R, a material having a high electron-transport property is used for the carrier-transport layer 144R, and a material having a high electron-injection property is used for the carrier-injection layer 145R. Note that in the case where the anode and the cathode are interchanged, the order of the layers between the anode and the cathode can be changed.

Similarly, the EL layer 122G of the display element 22G includes a carrier-injection layer 141G, a carrier-transport layer 142G, a light-emitting layer 143G, a carrier-transport layer 144G, and a carrier-injection layer 145G.

By independently forming the EL layer 122R, the EL layer 122B, and the EL layer 122G, the element structure in which each of the display elements is optimized can be obtained. For example, layers of different materials can be used as the EL layer 122R, the EL layer 122B, and the EL layer 122G. Owing to this, the color purity, emission efficiency, light extraction efficiency, and the like can be extremely high.

Although, in the drawing, the thickness of the layers included in the EL layer is substantially the same between the display elements, the thickness of the layers may be different from each other.

Structure Example 2

Figure 11B:
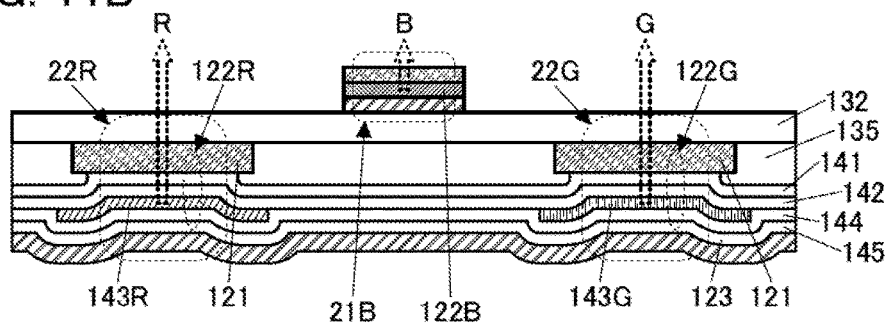

FIG. 11B illustrates an example in which only light-emitting layers are formed separately for the display elements 22R and 22G and the other layers are shared between the display elements 22R and 22G.

A carrier-injection layer 141, a carrier-transport layer 142, a carrier-transport layer 144, and a carrier-injection layer 145 are provided over the display element 22R and the display element 22G.

With such a structure, the manufacturing process can be simplified.

Note that one or more of the carrier-injection layer 141, the carrier-transport layer 142, the carrier-transport layer 144, and the carrier-injection layer 145 may be separately formed. For example, in the case where both a display element in which a phosphorescent light-emitting material is used for a light-emitting layer and a display element in which a fluorescent light-emitting material is used for a light-emitting layer are included, it is preferable that layers not shared therebetween be formed separately and the other layers be shared by the display elements.

Structure Example 3

One of the two display elements positioned on the same plane may have a light-emitting layer which partly overlaps with a light-emitting layer of the other display element.

Figure 11C:
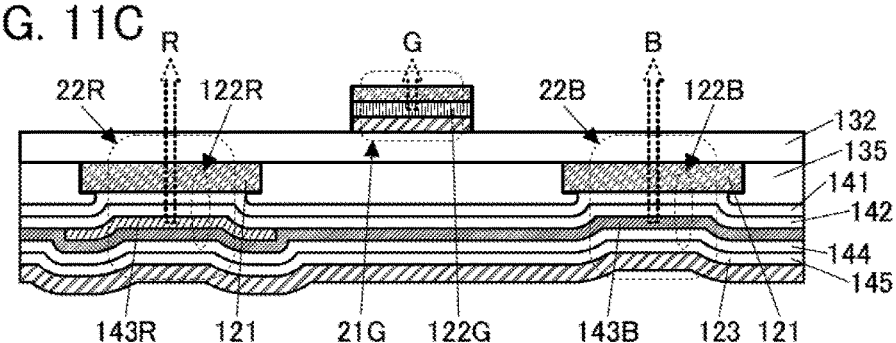

FIG. 11C illustrates an example in which the display element 21G is provided on the top side of the insulating layer 132, and the display element 22R and the display element 22B are provided on the bottom side.

The carrier-injection layer 141, the carrier-transport layer 142, the carrier-transport layer 144, and the carrier-injection layer 145 are provided over the display element 22R and the display element 22B.

Furthermore, a light-emitting layer 143B extends to the display element 22R as well as being provided in the display element 22B. The light-emitting layer 143B includes a region overlapping with the conductive layer 121 and the light-emitting layer 143R of the display element 22R.

In this case, in the display element 22R, part of the light-emitting layer 143B can function as a carrier-transport layer.

This structure can eliminate the step for separately forming the light-emitting layer 143B, reducing manufacturing cost.

In FIG. 11C, the light-emitting layer 143B which emits blue light B is provided to overlap with the light-emitting layer 143R which emits red light R. In this way, a light-emitting layer overlapping with the other display element preferably includes a light-emitting material having a larger bandgap than a light-emitting material included in a light-emitting layer of the other display element. This light-emitting layer can also be referred to as a light-emitting layer including a light-emitting material which emits light with a shorter wavelength.

For example, in a display element in which two light-emitting layers with different bandgaps are stacked, one of the light-emitting layers which has a smaller bandgap emits light preferentially and the other light-emitting layer hardly emits light, which therefore does not cause color mixing. As described later, when a microcavity structure is employed, a display element which emits light with a longer wavelength needs to have long optical length. The above-described structure with the two stacked different light-emitting layers can increase the optical length without increasing the manufacturing steps.

Structure Example 4

Figure 11D:
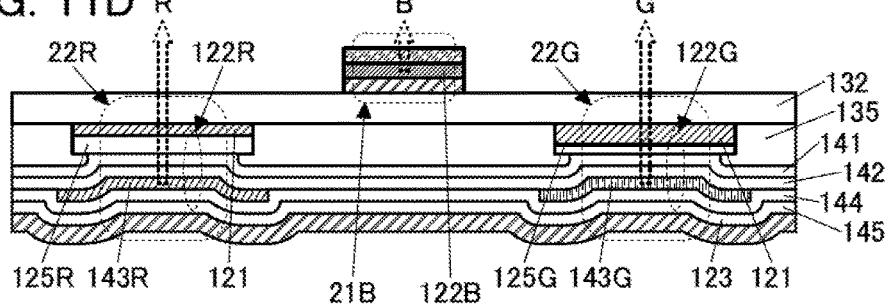

FIG. 11D illustrates an example in which the display element 22R and the display element 22G provided on the bottom side each have a microcavity structure.

The display element 22R includes an optical adjustment layer 125R between the conductive layer 121 and the carrier-injection layer 141. Furthermore, the display element 22G includes an optical adjustment layer 125G between the conductive layer 121 and the carrier-injection layer 141.

The optical adjustment layer 125R and the optical adjustment layer 125G are each a layer for adjusting optical length. In this example, the optical adjustment layer 125R is thicker than the optical adjustment layer 125G. As each of the optical adjustment layer 125R and the optical adjustment layer 125G, a conductive film which transmits visible light can be used. Preferably, an oxide conductive film is used.

As the conductive layer 121 provided in each of the display element 22R and the display element 22G, a conductive film having a semitransmissive property to visible light can be used. For example, a metal film or an alloy film having a thickness of more than or equal to 0.1 nm and less than or equal to 10 nm, preferably more than or equal to 0.5 nm and less than or equal to 5 nm, further preferably more than or equal to 1 nm and less than or equal to 4 nm can be used. Using a stacked-layer structure of the metal or alloy film and an oxide conductive film which transmits visible light is preferable for increased conductivity.

With this structure, the light R and the light G emitted by the display element 22R and the display element 22G can have high color purities. Thus, a display device with higher color reproducibility can be achieved.

In this case, as a conductive layer (e.g., the conductive layer 123a in FIG. 1C) positioned on the light extraction side of the display element 21B on the display surface side, a conductive film having an excellent light-transmitting property such as an oxide conductive film is preferably used.

Structure Example 5

Figure 12A:
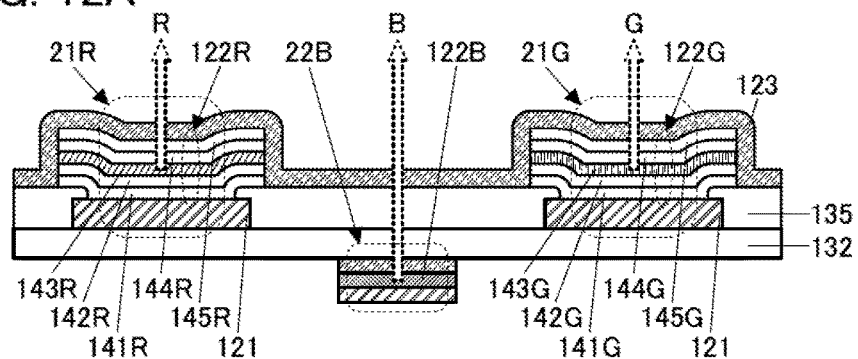
FIGS. 12A to 12D each illustrate a display device according to an embodiment.

FIG. 12A illustrates an example in which the top-emission display element 21R and the top-emission display element 21G are provided on the top side of the insulating layer 132 and the bottom-emission display element 22B is provided on the bottom side. The structure illustrated in FIG. 12A is a structure obtained by roughly turning upside down the structure illustrated in FIG. 11A.

The display element 21R and the display element 21G each include the conductive layer 121 which reflects visible light and the conductive layer 123 which transmits visible light.

In this case, the conductive layer 123 is preferably electrically connected to an auxiliary wiring through an opening provided in the insulating layer 135 or the like. Accordingly, a material having a high light-transmitting property and relatively low conductivity can be used as the conductive layer 123.

The display element 21R includes the carrier-injection layer 141R, the carrier-transport layer 142R, the light-emitting layer 143R, the carrier-transport layer 144R, and the carrier-injection layer 145R. The display element 21G includes the carrier-injection layer 141G, the carrier-transport layer 142G, the light-emitting layer 143G, the carrier-transport layer 144G, and the carrier-injection layer 145G.

Structure Example 6

Figure 12B:
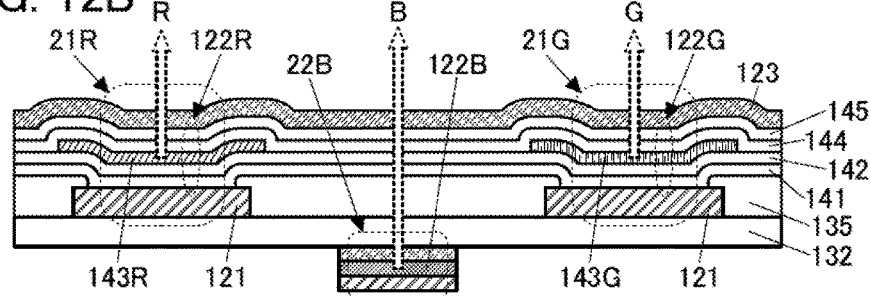

FIG. 12B illustrates an example in which only light-emitting layers are formed separately for display elements 21R and 21G and the other layers are shared between the display elements.

The carrier-injection layer 141, the carrier-transport layer 142, the carrier-transport layer 144, and the carrier-injection layer 145 are provided over the display element 21R and the display element 21G.

Structure Example 7

Figure 12C:
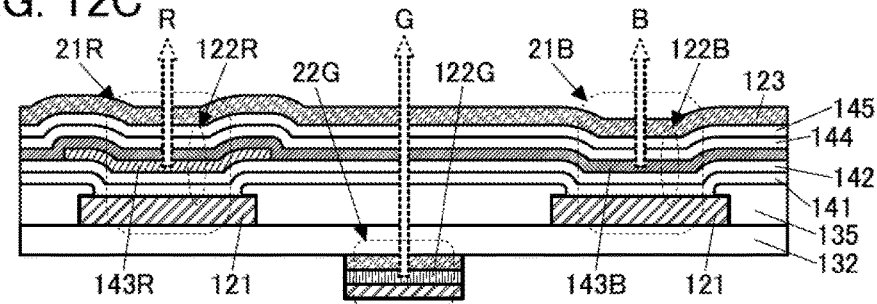

FIG. 12C illustrates an example in which the display element 21R and the display element 21B are provided on the top side of the insulating layer 132 and the display element 22G is provided on the bottom side. In addition, the light-emitting layer 143B of the display element 21B extends to a region of the display element 21R.

Structure Example 8

Figure 12D:
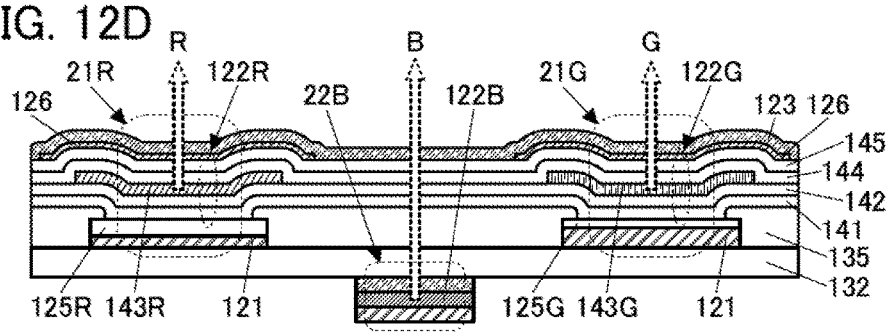

FIG. 12D illustrates an example in which a microcavity structure is applied to the display element 21R and the display element 21G.

The display element 21R and the display element 21G include the optical adjustment layer 125R and the optical adjustment layer 125G, respectively.

FIG. 12D illustrates an example in which island-shaped conductive layers 126 are provided between the conductive layer 123 and the carrier-injection layer 145. The conductive layers 126 include a conductive film having a semitransmissive property to visible light. The conductive layers 126 are provided so as to overlap with the light-emitting layer 143R and the light-emitting layer 143G.

Furthermore, the conductive layer 126 is provided so as not to be positioned on the path of the light B which is emitted by the display element 22B. This structure can increase the color purity of light emitted by the display element 21R and the display element 21G without reduction in light extraction efficiency of the display element 22B.

The above is the description of the light-emitting element.

Structure Example of Transistor

Structure examples of a transistor that can be used in the display device of one embodiment of the present invention are described below.

Structure Example 1

Figure 13A:
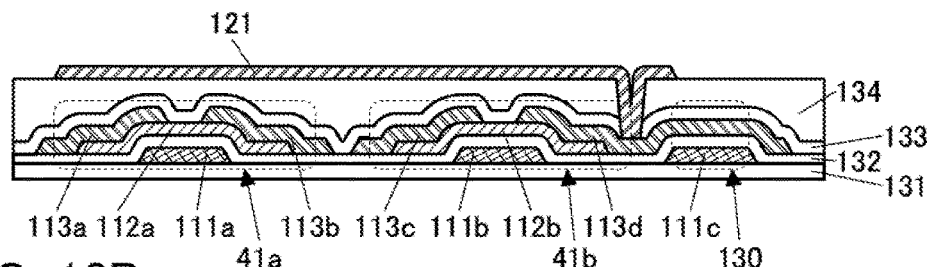
FIGS. 13A to 13C each illustrate a display device according to an embodiment.

FIG. 13A is a schematic cross-sectional view for one subpixel. The structure illustrated in FIG. 13A includes a transistor 41a, a transistor 41b, and a capacitor 130. The transistor 41a and the transistor 41b are channel-etched bottom-gate transistors having similar structures.

The transistor 41a functions as a switch for controlling the state of a pixel (subpixel) (selected state or unselected state), for example. In other words, the transistor 41a functions as a selection transistor. The transistor 41b is a transistor for controlling the amount of current flowing through a display element (not shown), for example, and functions as a driver transistor. Furthermore, the capacitor 130 functions as a storage capacitor for holding a potential written into the pixel (subpixel).

The transistor 41a includes the conductive layer 111a serving as a gate, part of the insulating layer 132 serving as a gate insulating layer, a semiconductor layer 112a, the conductive layer 113a serving as one of a source electrode and a drain electrode, and the conductive layer 113b serving as the other of the source electrode and the drain electrode.

The transistor 41b includes the conductive layer 111b serving as a gate, part of the insulating layer 132 serving as a gate insulating layer, a semiconductor layer 112b, a conductive layer 113c serving as one of a source electrode and a drain electrode, and a conductive layer 113d serving as the other of the source electrode and the drain electrode.

In the example of FIG. 13A, the capacitor 130 is made up of a conductive layer 111c formed by processing the same conductive film that is used for forming the conductive layer 111a and the like, part of the insulating layer 132, and part of the conductive layer 113d of the transistor 41b.

Furthermore, the conductive layer 121 functioning as a pixel electrode of the display element is electrically connected to the conductive layer 113d through an opening provided in the insulating layer 134 and the insulating layer 133. Note that the components provided over the conductive layer 121 (e.g., an EL layer) are not illustrated here.

This structure allows the transistor 41a, the transistor 41b, and the capacitor 130 to be formed through the same process, so that the manufacturing process can be simplified.

Figure 13B:
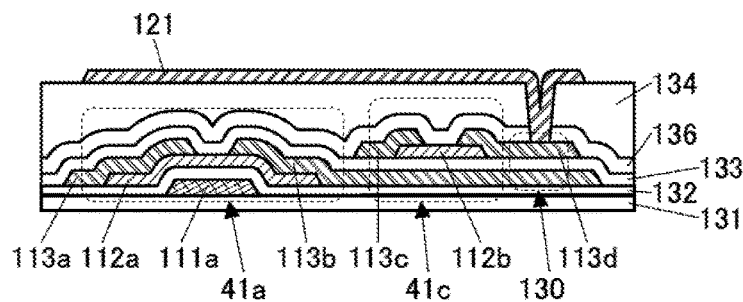
Figure 13C:
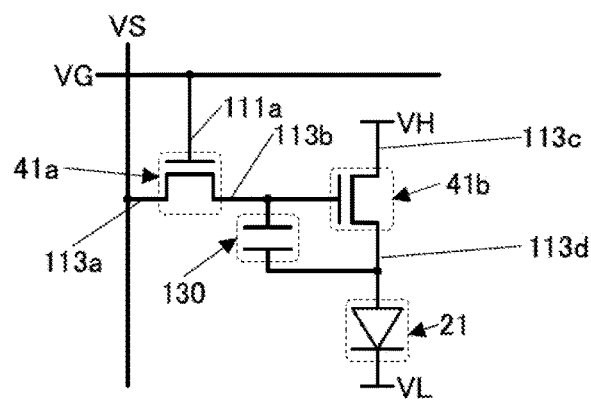

FIG. 13C is a circuit diagram for the structure illustrated in FIG. 13A. FIG. 13C is a circuit diagram for one pixel (subpixel). The circuit illustrated in FIG. 13C includes the transistor 41a, the transistor 41b, the capacitor 130, and a display element 21.

For example, a gate (the conductive layer 111a) of the transistor 41a is electrically connected to a wiring to which a gate signal VG is applied. One of a source and a drain (the conductive layer 113a) of the transistor 41a is electrically connected to a wiring to which a source signal VS is applied. One of a source and a drain (the conductive layer 113c) of the transistor 41b is electrically connected to a wiring to which a potential VH is applied. The common electrode (e.g., the conductive layer 123) of the display element 21 is electrically connected to a wiring to which a potential VL is applied.

Note that the pixel structure is not limited to this example and a variety of circuit configurations can be used.

Structure Example 2

Described below are other structure examples in which two transistors are stacked. The structure examples described below can be combined as appropriate with the above-described cross-sectional structure examples of the display device.

FIG. 13B illustrates an example in which the transistor 41a and a transistor 41c are stacked.

For the structure of the transistor 41a, the structure example 1 can be referred to.

The insulating layer 133 is provided to cover the transistor 41a. The insulating layer 133 functions as a protective layer for protecting the transistor 41a.

The transistor 41c includes the semiconductor layer 112b over the conductive layer 113b with the insulating layer 133 sandwiched therebetween, and includes the conductive layer 113c and the conductive layer 113d which are in contact with the semiconductor layer 112b. Part of the conductive layer 113b functions as a gate of the transistor 41c. Part of the insulating layer 133 functions as a gate insulating layer of the transistor 41c. The conductive layer 113c and the conductive layer 113d function as a source and a drain of the transistor 41b.

Thus, the transistor 41c is positioned over the transistor 41a. Furthermore, the conductive layer 113b serves as both one of a source and a drain of the transistor 41a and a gate of the transistor 41c. The area occupied by the transistors 41a and 41c can be reduced in this structure as compared with a structure in which they are provided side by side on the same plane.

Part of the conductive layer 113d, part of the insulating layer 133, and part of the conductive layer 113b are stacked to form the capacitor 130. The capacitor 130 functions as a storage capacitor of the pixel.

An insulating layer 136 and the insulating layer 134 are provided to cover the transistor 41c. The insulating layer 136 functions as a protective layer for protecting the transistor 41b. The insulating layer 134 preferably serves as a planarization film. Note that either one of the insulating layers 136 and 134 is not necessarily provided if not needed.

The conductive layer 121 is electrically connected to the conductive layer 113d through an opening provided in the insulating layers 134 and 136.

The above is the description of the structure example 2.

Structure Example 3

Figure 14A:
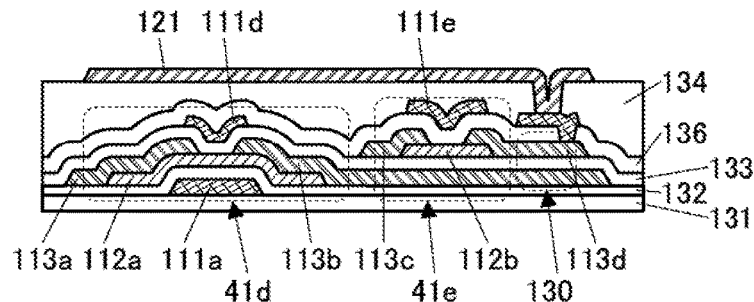
FIGS. 14A to 14E each illustrate a display device according to an embodiment.

FIG. 14A illustrates an example in which a transistor 41d and a transistor 41e are stacked.

The transistor 41d corresponds to the transistor 41a illustrated in FIG. 13B or the like further including a conductive layer 111d serving as a second gate. The conductive layer 111d is provided so as to overlap with the semiconductor layer 112a and is positioned between the insulating layer 133 and the insulating layer 136.

The transistor 41e corresponds to the transistor 41c illustrated in FIG. 13B further including a conductive layer 111e serving as a second gate. The conductive layer 111e is provided so as to overlap with the semiconductor layer 112b and is positioned over the insulating layer 136.

When a transistor includes two gates between which a semiconductor layer is sandwiched, the on-state current of the transistor can be increased by supplying the same potential to the two gates. When a potential for controlling the threshold voltage is supplied to one of the gates and a potential for driving the transistor to the other gate, the threshold voltage of the transistor can be controlled.

Structure Example 4

Figure 14B:
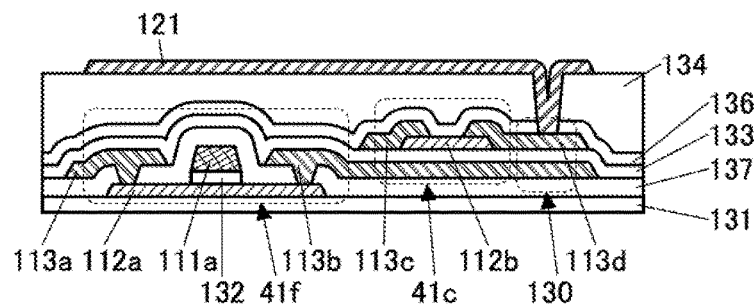

FIG. 14B illustrates an example in which a transistor 41f and the transistor 41c are stacked.

For the structure of the transistor 41c, the above description can be referred to.

The transistor 41f is a top-gate transistor including a top gate over the semiconductor layer 112a.

The transistor 41f includes the semiconductor layer 112a over the insulating layer 131, the insulating layer 132 over the semiconductor layer 112a, the conductive layer 111a over the insulating layer 132, an insulating layer 137 covering the semiconductor layer 112a and the conductive layer 111a, and the conductive layer 113a and the conductive layer 113b over the insulating layer 137.

The transistor 41f is preferable because parasitic capacitance between the semiconductor layer 112a and the conductive layer 113a or the conductive layer 113b and parasitic capacitance between the conductive layer 111a and the conductive layer 113a or the conductive layer 113b can be reduced.

Figure 14C:
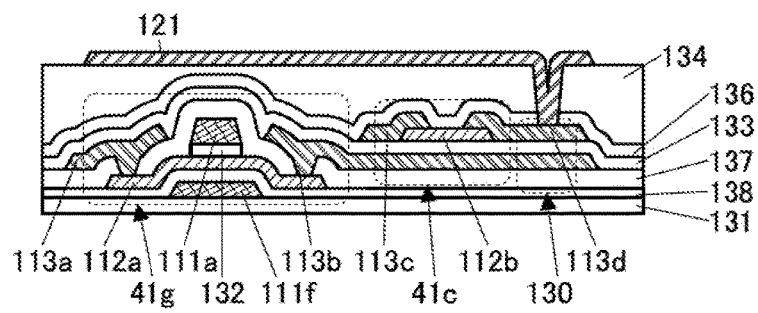
Figure 14D:
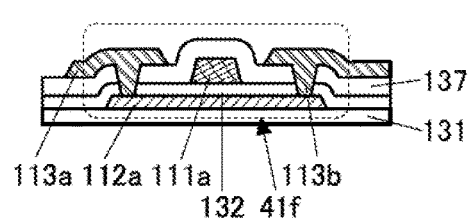

Although the insulating layer 132 is formed only in the region overlapping with the conductive layer 111a in the example illustrated in FIG. 14B, the insulating layer 132 may cover an edge of the semiconductor layer 112a as illustrated in FIG. 14D.

Structure Example 5

FIG. 14C illustrates an example in which a transistor 41g and the transistor 41c are stacked.

For the structure of the transistor 41c, the above description can be referred to.

The transistor 41g corresponds to the transistor 41f further including the conductive layer 111f serving as a second gate. The conductive layer 111f is positioned so as to overlap with the semiconductor layer 112a with an insulating layer 138 provided therebetween.

Figure 14E:
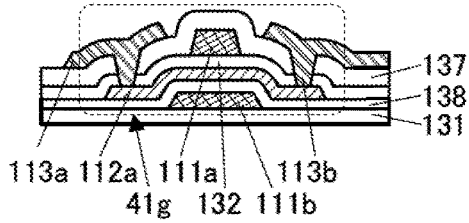

Although the insulating layer 132 is formed only in the region overlapping with the conductive layer 111 in the example illustrated in FIG. 14C, the insulating layer 132 may cover the edge of the semiconductor layer 112a as illustrated in FIG. 14E.

Structure Example 6

Figure 15A:
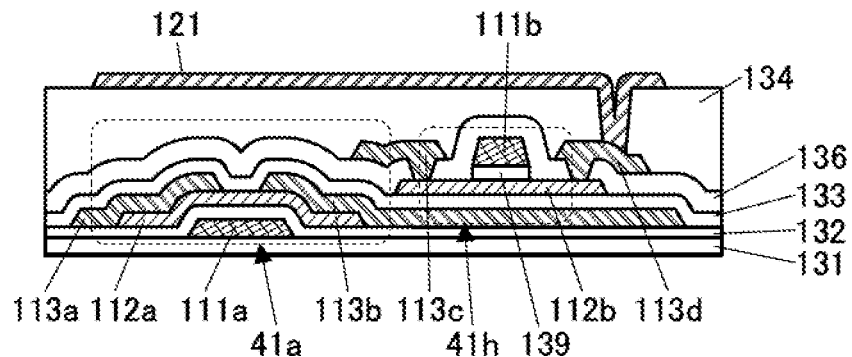
FIGS. 15A to 15C each illustrate a display device according to an embodiment.

FIG. 15A illustrates an example in which the transistor 41a and a transistor 41h are stacked.

The transistor 41h is a top-gate transistor including a top gate over the semiconductor layer 112b.

The transistor 41h includes the semiconductor layer 112b over the insulating layer 133, an insulating layer 139 functioning as a gate insulating layer over the semiconductor layer 112a, the conductive layer 111b over the insulating layer 139, the insulating layer 136 covering the semiconductor layer 112a and the conductive layer 111b, and the conductive layer 113c and the conductive layer 113d over the insulating layer 136.

The conductive layer 113b and the conductive layer 111b each function as a gate of the transistor 41h.

In the example illustrated in FIG. 15A, a capacitor consists of part of the semiconductor layer 112b, part of the conductive layer 113b, and part of the insulating layer 133. The capacitor may be used as a storage capacitor. In that case, another capacitor is not necessarily provided.

Although the insulating layer 139 is formed only in the region overlapping with the conductive layer 111b in the example of FIG. 15A, the insulating layer 139 may cover the edge of the semiconductor layer 112b like the insulating layer 132 in FIG. 14E and the like.

Structure Example 7

Figure 15B:
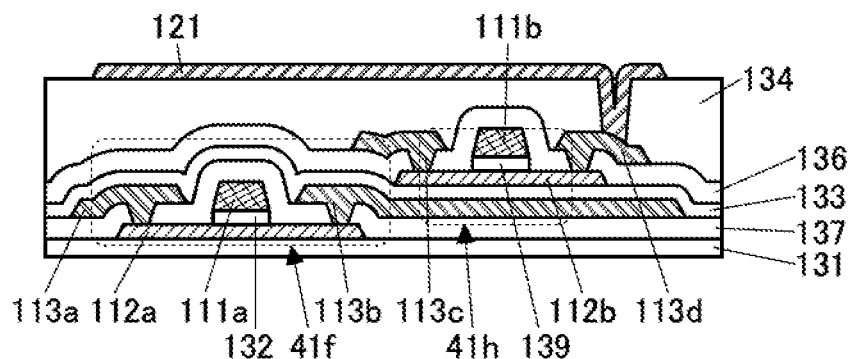

FIG. 15B illustrates an example in which the transistor 41f and the transistor 41h are stacked. For the transistor 41f and the transistor 41h, the above description can be referred to.

This structure enables a display device with extremely low parasitic capacitance.

Structure Example 8

Figure 15C:
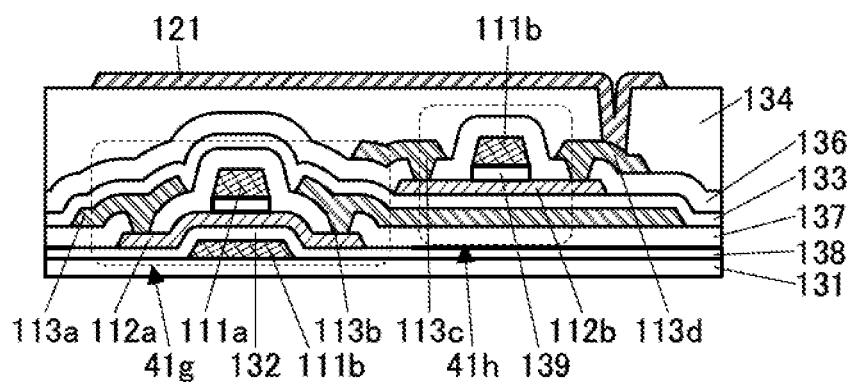

FIG. 15C illustrates an example in which the transistor 41g and the transistor 41h are stacked. For the transistor 41g and the transistor 41h, the above description can be referred to.

This structure enables a display device with extremely low parasitic capacitance.

The above is the description of the structural examples of the transistor.

[Components]

The above-described components will be described below.

[Substrate]

A material having a flat surface can be used as the substrate included in the display panel. The substrate on the side from which light from the display element is extracted is formed using a material transmitting the light. For example, a material such as glass, quartz, ceramics, sapphire, or an organic resin can be used.

The weight and thickness of the display panel can be reduced by using a thin substrate. A flexible display panel can be obtained by using a substrate that is thin enough to have flexibility.

Since the substrate through which light is not extracted does not need to have a light-transmitting property, a metal substrate or the like can be used, other than the above-mentioned substrates. A metal substrate, which has high thermal conductivity, is preferable because it can easily conduct heat to the whole substrate and accordingly can prevent a local temperature rise in the display panel. To obtain flexibility and bendability, the thickness of a metal substrate is preferably greater than or equal to 10 μm and less than or equal to 200 μm, further preferably greater than or equal to 20 μm and less than or equal to 50 μm.

Although there is no particular limitation on a material of a metal substrate, it is favorable to use, for example, a metal such as aluminum, copper, and nickel, an aluminum alloy, or an alloy such as stainless steel.

It is possible to use a substrate subjected to insulation treatment, e.g., a metal substrate whose surface is oxidized or provided with an insulating film. The insulating film may be formed by, for example, a coating method such as a spin-coating method or a dipping method, an electrodeposition method, an evaporation method, or a sputtering method. An oxide film may be formed on the substrate surface by exposure to or heating in an oxygen atmosphere or by an anodic oxidation method or the like.

Examples of the material that has flexibility and transmits visible light include glass which is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. It is particularly preferable to use a material with a low thermal expansion coefficient, for example, a material with a thermal expansion coefficient lower than or equal to $30 \times 10^{-6}$/K, such as a polyamide imide resin, a polyimide resin, or PET. A substrate in which a glass fiber is impregnated with an organic resin or a substrate whose thermal expansion coefficient is reduced by mixing an inorganic filler with an organic resin can also be used. A substrate using such a material is lightweight, and thus a display panel using this substrate can also be lightweight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol-based fiber, a polyester-based fiber, a polyamide-based fiber, a polyethylene-based fiber, an aramid-based fiber, a polyparaphenylene benzobisoxazole fiber, a glass fiber, and a carbon fiber. As the glass fiber, a glass fiber using E glass, S glass, D glass, Q glass, or the like can be used. These fibers may be used in a state of a woven or nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Alternatively, glass, metal, or the like that is thin enough to have flexibility can be used as the substrate. Alternatively, a composite material where glass and a resin material are attached to each other with an adhesive layer may be used.

A hard coat layer (e.g., silicon nitride, aluminum oxide) by which a surface of a display panel is protected from damage or the like, a layer (e.g., an aramid resin) that can disperse pressure, or the like may be stacked over the flexible substrate. Furthermore, to suppress a decrease in lifetime of the display element due to moisture and the like, an insulating film with low water permeability may be stacked over the flexible substrate. For example, an inorganic insulating material such as silicon nitride, silicon oxynitride, silicon nitride oxide, aluminum oxide, or aluminum nitride oxide can be used.

The substrate may be formed by stacking a plurality of layers. When a glass layer is used, a barrier property against water and oxygen can be improved and thus a highly reliable display panel can be provided.

[Transistor]

The transistor includes a conductive layer serving as a gate electrode, a semiconductor layer, a conductive layer serving as a source electrode, a conductive layer serving as a drain electrode, and an insulating layer serving as a gate insulating layer. In the above, a bottom-gate transistor is used.

Note that there is no particular limitation on the structure of the transistor included in the display device of one embodiment of the present invention. For example, a planar transistor, a staggered transistor, or an inverted staggered transistor can be used. A top-gate transistor or a bottom-gate transistor may also be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferred that a semiconductor having crystallinity be used, in which case deterioration of the transistor characteristics can be suppressed.

As a semiconductor material used for the transistor, an element of Group 14 (e.g., silicon or germanium), a compound semiconductor, or an oxide semiconductor can be used, for example. Typically, a semiconductor containing silicon, a semiconductor containing gallium arsenide, an oxide semiconductor containing indium, or the like can be used.

In particular, an oxide semiconductor having a wider band gap than silicon is preferably used. A semiconductor material having a wider band gap and a lower carrier density than silicon is preferably used because a current that flows through the transistor when it is in an off state can be reduced.

For the semiconductor layer, it is particularly preferable to use an oxide semiconductor including a plurality of crystal parts whose c-axes are aligned substantially perpendicular to a surface on which the semiconductor layer is formed or the top surface of the semiconductor layer and in which a grain boundary is not observed between adjacent crystal parts.

There is no grain boundary in such an oxide semiconductor; therefore, generation of a crack in an oxide semiconductor film which is caused by stress when a display panel is bent is prevented. Therefore, such an oxide semiconductor can be favorably used for a flexible display panel which is used in a bent state, or the like.

Moreover, the use of such an oxide semiconductor with crystallinity for the semiconductor layer makes it possible to provide a highly reliable transistor with a small change in electrical characteristics.

In a transistor with an oxide semiconductor whose band gap is larger than the band gap of silicon, charges stored in a capacitor that is connected in series to the transistor can be held for a long time, owing to the low off-state current of the transistor. When such a transistor is used for a pixel, operation of a driver circuit can be stopped while a gray scale in each pixel is maintained. As a result, a display device with extremely low power consumption is obtained.

The semiconductor layer preferably includes, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electrical characteristics of the transistor including the oxide semiconductor, the oxide semiconductor preferably contains a stabilizer in addition to In, Zn, and M.

Examples of the stabilizer, including metals that can be used as M, are gallium, tin, hafnium, aluminum, and zirconium. As another example of the stabilizer, lanthanoid such as lanthanum, cerium, praseodymium, neodymium, samarium, europium, gadolinium, terbium, dysprosium, holmium, erbium, thulium, ytterbium, or lutetium can be given.

As an oxide semiconductor included in the semiconductor layer, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, an "In—Ga—Zn-based oxide" means an oxide containing In, Ga, and Zn as its main components and there is no limitation on the ratio of In:Ga:Zn. In addition to In, Ga, and Zn, another metal element may be contained.

The semiconductor layer and the conductive layer may include the same metal element contained in the above oxide. The use of the same metal element for the semiconductor layer and the conductive layer can reduce the manufacturing cost. For example, the use of metal oxide targets with the same metal composition can reduce the manufacturing cost. In addition, the same etching gas or the same etchant can be used in processing the semiconductor layer and the conductive layer. Note that even when the semiconductor layer and the conductive layer include the same metal elements, they have different compositions in some cases. For example, a metal element in a film is released during the manufacturing process of the transistor and the capacitor, which might result in different metal compositions.

The energy gap of the oxide semiconductor included in the semiconductor layer is 2 eV or more, preferably 2.5 eV or more, and further preferably 3 eV or more. The use of such an oxide semiconductor having a wide energy gap leads to a reduction in the off-state current of a transistor.

In the case where the oxide semiconductor included in the semiconductor layer is an In-M-Zn oxide, it is preferable that the atomic ratio of metal elements of a sputtering target used for forming a film of the In-M-Zn oxide satisfy In≥M and Zn≥M As the atomic ratio of metal elements of such a sputtering target, In:M:Zn=1:1:1, In:M:Zn=1:1:1.2, In:M:Zn=3:1:2, In:M:Zn=4:2:4.1 and the like are preferable. Note that the atomic ratio of metal elements in the formed semiconductor layer varies from the above atomic ratio of metal elements of the sputtering target within a range of ±40% as an error.

An oxide semiconductor film with low carrier density is used as the semiconductor layer. For example, the semiconductor layer is an oxide semiconductor film whose carrier density is lower than or equal to $1\times10^{17}$/cm$^3$, preferably lower than or equal to $1\times10^{15}$/cm$^3$, further preferably lower than or equal to $1\times10^{13}$/cm$^3$, still further preferably lower than or equal to $1\times10^{11}$/cm$^3$, even further preferably lower than $1\times10^{10}$/cm$^3$, and higher than or equal to $1\times10^{9}$/cm$^3$. Such an oxide semiconductor is referred to as a highly purified intrinsic or substantially highly purified intrinsic oxide semiconductor. The oxide semiconductor has a low impurity concentration and a low density of defect states and can thus be referred to as an oxide semiconductor having stable characteristics.

Note that, without limitation to those described above, a material with an appropriate composition may be used depending on required semiconductor characteristics and electrical characteristics (e.g., field-effect mobility and threshold voltage) of a transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon that is one of elements belonging to Group 14 is contained in the oxide semiconductor contained in the semiconductor layer, oxygen vacancies are increased in the semiconductor layer, and the semiconductor layer becomes n-type. Thus, the concentration of silicon or carbon (measured by secondary ion mass spectrometry) in the semiconductor layer is lower than or equal to $2\times10^{18}$ atoms/cm$^3$, preferably lower than or equal to $2\times10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal of the semiconductor layer, which is measured by secondary ion mass spectrometry, is lower than or equal to $1\times10^{18}$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. Thus, a transistor including an oxide semiconductor which contains nitrogen is likely to be normally on. Hence, the concentration of nitrogen in the semiconductor layer which is measured by secondary ion mass spectrometry is preferably lower than or equal to $5\times10^{18}$ atoms/cm$^3$.

The semiconductor layer may have a non-single-crystal structure, for example. The non-single-crystal structure includes CAAC-OS (c-axis aligned crystalline oxide semiconductor, or c-axis aligned a-b-plane-anchored crystalline oxide semiconductor), a polycrystalline structure, a microcrystalline structure, or an amorphous structure, for example. Among the non-single-crystal structures, an amorphous structure has the highest density of defect states, whereas CAAC-OS has the lowest density of defect states.

An oxide semiconductor film having an amorphous structure has disordered atomic arrangement and no crystalline component, for example. Alternatively, an oxide film having an amorphous structure has, for example, an absolutely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single-crystal structure. The mixed film has, for example, a single-layer structure or a stacked-layer structure including two or more of the above-described regions in some cases.

<Composition of CAC-OS>

Described below is the composition of a cloud-aligned composite oxide semiconductor (CAC-OS) that can be used in a transistor disclosed in one embodiment of the present invention.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which indium oxide ($InO_{X1}$, where X1 is a real number greater than 0) or indium zinc oxide ($In_{X2}Zn_{Y2}O_{Z2}$, where X2, Y2, and Z2 are real numbers greater than 0) forming a mosaic pattern is evenly distributed in the film (this composition is also referred to as a cloud-like composition). The mosaic pattern is formed by separating the materials into $InO_{X1}$ or $In_{X2}Zn_{Y2}O_{Z2}$ and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), for example.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region is described as having higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

The CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part of the CAC-OS, and these nanoparticle regions are randomly dispersed to form a mosaic pattern in the CAC-OS.

The CAC-OS can be formed by a sputtering method under a condition where a substrate is not heated intentionally. In the case where the CAC-OS is formed by a sputtering method, one or more of an inert gas (typically, argon), an oxygen gas, and a nitrogen gas are used as a deposition gas. Furthermore, the flow rate of the oxygen gas to the total flow rate of the deposition gas in deposition is preferably as low as possible, for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an out-of-plane method with an X-ray diffraction (XRD). That is, it is found by the XRD that there are no alignment in the a-b plane direction and no alignment in the c-axis direction in the measured areas.

In the CAC-OS, an electron diffraction pattern that is obtained by irradiation with an electron beam with a probe diameter of 1 nm (also referred to as nanobeam electron beam) has regions with high luminance in a ring pattern and a plurality of bright spots appear in the ring-like pattern. Thus, it is found from the electron diffraction pattern that the crystal structure of the CAC-OS includes a nanocrystalline (nc) structure that does not show alignment in the plane direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the regions including $GaO_{X3}$ as a main component and the regions including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is generated. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used in a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element including a CAC-OS has high reliability. Thus, the CAC-OS is suitably used in a variety of semiconductor devices typified by a display.

Alternatively, silicon is preferably used as a semiconductor in which a channel of a transistor is formed. Although amorphous silicon may be used as silicon, silicon having crystallinity is particularly preferable. For example, microcrystalline silicon, polycrystalline silicon, single-crystal silicon, or the like is preferably used. In particular, polycrystalline silicon can be formed at a lower temperature than single-crystal silicon and has higher field effect mobility and higher reliability than amorphous silicon. When such a polycrystalline semiconductor is used for a pixel, the aperture ratio of the pixel can be improved. Even in the case where the display portion with extremely high definition is provided, a gate driver circuit and a source driver circuit can be formed over a substrate over which the pixels are formed, and the number of components of an electronic device can be reduced.

The bottom-gate transistor described in this embodiment is preferable because the number of manufacturing steps can be reduced. When amorphous silicon, which can be formed at a lower temperature than polycrystalline silicon, is used for the semiconductor layer, materials with low heat resistance can be used for a wiring, an electrode, or a substrate below the semiconductor layer, resulting in wider choice of materials. For example, an extremely large glass substrate can be favorably used. Meanwhile, the top-gate transistor is preferable because an impurity region is easily formed in a self-aligned manner and variation in characteristics can be reduced. In that case, the use of polycrystalline silicon, single-crystal silicon, or the like is particularly preferable.

[Conductive Layer]

As materials for the gates, the source, and the drain of a transistor, and the conductive layers serving as the wirings and electrodes included in the display device, any of metals such as aluminum, titanium, chromium, nickel, copper, yttrium, zirconium, molybdenum, silver, tantalum, and tungsten, or an alloy containing any of these metals as its main component can be used. A single-layer structure or a layered structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of a shape by etching is increased.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium or an alloy material containing any of these metal materials can be used. Alternatively, a nitride of the metal material (e.g., titanium nitride) or the like may be used. In the case of using the metal material or the alloy material (or the nitride thereof), the thickness is set small enough to allow light transmission. Alternatively, a layered film of any of the above materials can be used as the conductive layer. For example, a layered film of indium tin oxide and an alloy of silver and magnesium is preferably used because the conductivity can be increased. They can also be used for conductive layers such as a variety of wirings and electrodes included in a display device, and conductive layers (e.g., conductive layers serving as a pixel electrode or a common electrode) included in a display element.

[Insulating Layer]

Examples of an insulating material that can be used for the insulating layers include a resin such as acrylic or epoxy resin, a resin having a siloxane bond, and an inorganic insulating material such as silicon oxide, silicon oxynitride, silicon nitride oxide, silicon nitride, or aluminum oxide.

The light-emitting element is preferably provided between a pair of insulating films with low water permeability, in which case entry of impurities such as water into the light-emitting element can be inhibited. Thus, a decrease in device reliability can be suppressed.

As an insulating film with low water permeability, a film containing nitrogen and silicon, such as a silicon nitride film or a silicon nitride oxide film, a film containing nitrogen and aluminum, such as an aluminum nitride film, or the like can be used. Alternatively, a silicon oxide film, a silicon oxynitride film, an aluminum oxide film, or the like may be used.

For example, the amount of water vapor transmission of the insulating film with low water permeability is lower than or equal to $1\times10^{-5}[g/(m^2\cdot day)]$, preferably lower than or equal to $1\times10^{-6}[g/(m^2\cdot day)]$, further preferably lower than or equal to $1\times10^{-7}[g/(m^2\cdot day)]$, still further preferably lower than or equal to $1\times10^{-8}[g/(m^2\cdot day)]$.

[Light-Emitting Element]

As the light-emitting element, a self-luminous element can be used, and an element whose luminance is controlled by current or voltage is included in the category of the light-emitting element. Since the luminance and the chromaticity of light emitted from such an element are not influenced by external light, an image with high color reproducibility (a wide color gamut) and a high contrast, i.e., a clear image can be displayed.

For example, a self-luminous light-emitting element such as a light-emitting diode (LED), an organic light-emitting diode (OLED), a quantum-dot light-emitting diode (QLED), and an inorganic EL element can be used.

The light-emitting element can have a top emission structure, a bottom emission structure, a dual emission structure, and the like. A conductive film that transmits visible light is used as the electrode through which light is extracted. A conductive film that reflects visible light is preferably used as the electrode through which light is not extracted.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer, either a low-molecular compound or a high-molecular compound can be used, and an inorganic compound may also be used. Each of the layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between a cathode and an anode, holes are injected to the EL layer from the anode side and electrons are injected to the EL layer from the cathode side. The injected electrons and holes are recombined in the EL layer and a light-emitting substance contained in the EL layer emits light.

In the case where a light-emitting element emitting white light is used as the light-emitting element, the EL layer preferably contains two or more kinds of light-emitting substances. For example, the two or more kinds of light-emitting substances are selected so as to emit light of complementary colors to obtain white light emission. Specifically, it is preferable to contain two or more selected from light-emitting substances that emit light of red (R), green (G), blue (B), yellow (Y), orange (O), and the like and light-emitting substances that emit light containing two or more of spectral components of R, G, and B. The light-emitting element preferably emits light with a spectrum having two or more peaks in the wavelength range of a visible light region (e.g., 350 nm to 750 nm). An emission spectrum of a material that emits light having a peak in a yellow wavelength range preferably includes spectral components also in green and red wavelength ranges.

A light-emitting layer containing a light-emitting material that emits light of one color and a light-emitting layer containing a light-emitting material that emits light of another color are preferably stacked in the EL layer. For example, the plurality of light-emitting layers in the EL layer may be stacked in contact with each other or may be stacked with a region not including any light-emitting material therebetween. For example, between a fluorescent layer and a phosphorescent layer, a region containing the same material as one in the fluorescent layer or the phosphorescent layer (for example, a host material or an assist material) and no light-emitting material may be provided. This facilitates the manufacture of the light-emitting element and reduces the drive voltage.

The light-emitting element may be a single element including one EL layer or a tandem element in which a plurality of EL layers are stacked with a charge generation layer therebetween.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stack of any of the above materials can be used for the conductive layers. For example, a stack of indium tin oxide and an alloy of silver and magnesium is preferably used, in which case conductivity can be increased. Still alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy containing silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the above conductive film that transmits visible light and a film containing a metal material may be stacked. For example, a stack of silver and indium tin oxide, a stack of an alloy of silver and magnesium and indium tin oxide, or the like can be used.

Each of the electrodes can be formed by an evaporation method or a sputtering method. Alternatively, a discharging method such as an inkjet method, a printing method such as a screen printing method, or a plating method may be used.

Note that the aforementioned light-emitting layer and layers containing a substance with a high hole-injection property, a substance with a high hole-transport property, a substance with a high electron-transport property, a substance with a high electron-injection property, a substance with a bipolar property, and the like may include an inorganic compound such as a quantum dot or a high molecular compound (e.g., an oligomer, a dendrimer, and a polymer). For example, when used for the light-emitting layer, the quantum dot can function as a light-emitting material.

The quantum dot may be a colloidal quantum dot, an alloyed quantum dot, a core-shell quantum dot, a core quantum dot, or the like. A quantum dot containing elements belonging to Groups 12 and 16, elements belonging to Groups 13 and 15, or elements belonging to Groups 14 and 16 may be used. Alternatively, a quantum dot containing an element such as cadmium, selenium, zinc, sulfur, phosphorus, indium, tellurium, lead, gallium, arsenic, or aluminum may be used.

[Adhesive Layer]

As the adhesive layer, any of a variety of curable adhesives, e.g., a photo-curable adhesive such as an ultraviolet curable adhesive, a reactive curable adhesive, a thermosetting curable adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Still alternatively, an adhesive sheet or the like may be used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can inhibit entry of impurities such as moisture into an element, leading to an improvement in the reliability of the display panel.

In addition, a filler with a high refractive index or a light-scattering member may be mixed into the resin, in which case light extraction efficiency can be improved. For example, titanium oxide, barium oxide, zeolite, or zirconium can be used.

[Connection Layer]

As a connection layer, an anisotropic conductive film (ACF), an anisotropic conductive paste (ACP), or the like can be used.

The above is the description of each of the components.

Example of Manufacturing Method

Here, separation method examples and manufacturing method examples of a display panel using a flexible substrate are described.

Here, layers including a display element, a circuit, a wiring, an electrode, optical members such as a coloring layer and a light-blocking layer, an insulating layer, and the like, are collectively referred to as an element layer. The element layer includes, for example, a display element, and may additionally include a wiring electrically connected to the display element or an element such as a transistor used in a pixel or a circuit.

In addition, here, a flexible member which supports the element layer at a stage at which the display element is completed (the manufacturing process is finished) is referred to as a substrate. For example, a substrate includes an extremely thin film with a thickness greater than or equal to 10 nm and less than or equal to 300 µm and the like.

As a method for forming an element layer over a flexible substrate provided with an insulating surface, typically, there are two methods shown below. One of them is to directly form an element layer over the substrate. The other method is to form an element layer over a support substrate that is different from the substrate and then to separate and transfer the element layer from the support substrate to the substrate. Although not described in detail here, in addition to the above two methods, there is a method in which the element layer is formed over a substrate which does not have flexibility and the substrate is thinned by polishing or the like to have flexibility.

In the case where a material of the substrate can withstand heating temperature in a process for forming the element layer, it is preferable that the element layer be formed directly over the substrate, in which case a manufacturing process can be simplified. At this time, the element layer is preferably formed in a state where the substrate is fixed to a support substrate, in which case transfer thereof in an apparatus and between apparatuses can be easy.

In the case of employing the method in which the element layer is formed over the support substrate and then transferred to the substrate, first, a separation layer and an insulating layer are stacked over the support substrate, and then the element layer is formed over the insulating layer. Next, the element layer is separated from the support substrate and then transferred to the substrate. At this time, selected is a material with which separation at an interface between the support substrate and the separation layer, at an interface between the separation layer and the insulating layer, or in the separation layer occurs. In the method, it is preferable that a material having high heat resistance be used for the support substrate or the separation layer, in which case the upper limit of the temperature applied when the element layer is formed can be increased, and an element layer including a more highly reliable element can be formed.

For example, it is preferable that a stack of a layer containing a high-melting-point metal material, such as tungsten, and a layer containing an oxide of the metal material be used as the separation layer, and a stack of a plurality of layers such as a silicon oxide layer, a silicon nitride layer, a silicon oxynitride layer, and a silicon nitride oxide layer be used as the insulating layer over the separation layer. Note that in this specification, oxynitride contains more oxygen than nitrogen, and nitride oxide contains more nitrogen than oxygen.

As the method for separating the support substrate from the element layer, applying mechanical force, etching the separation layer, and making a liquid permeate the separation interface are given as examples. Alternatively, separation may be performed by heating or cooling the support substrate by utilizing a difference in thermal expansion coefficient of two layers which form the separation interface.

The separation layer is not necessarily provided in the case where the separation can be performed at an interface between the support substrate and the insulating layer.

For example, glass and an organic resin such as polyimide can be used as the support substrate and the insulating layer, respectively. In that case, a separation trigger may be formed by, for example, locally heating part of the organic resin with laser light or the like, or by physically cutting part of or making a hole through the organic resin with a sharp tool, so that separation may be performed at an interface between the glass and the organic resin.

Alternatively, a heat generation layer may be provided between the support substrate and the insulating layer formed of an organic resin, and separation may be performed at an interface between the heat generation layer and the insulating layer by heating the heat generation layer. As the heat generation layer, any of a variety of materials such as a material which generates heat when current flows therethrough, a material which generates heat by absorbing light, and a material which generates heat when a magnetic field is applied thereto can be used. For example, for the heat generation layer, a material selected from a semiconductor, a metal, and an insulator can be used.

In the above-described methods, the insulating layer formed of an organic resin can be used as a substrate after the separation.

The above is the description of the manufacturing method of the flexible display panel.

At least part of this embodiment can be implemented in combination with any of the other embodiments described in this specification as appropriate.

Embodiment 2

In this embodiment, a structure example of the display device of one embodiment of the present invention will be described. The display device described below includes two kinds of display elements which are provided on the opposite sides of an insulating layer and emit light in the same direction.

Structure Example

Figure 17:
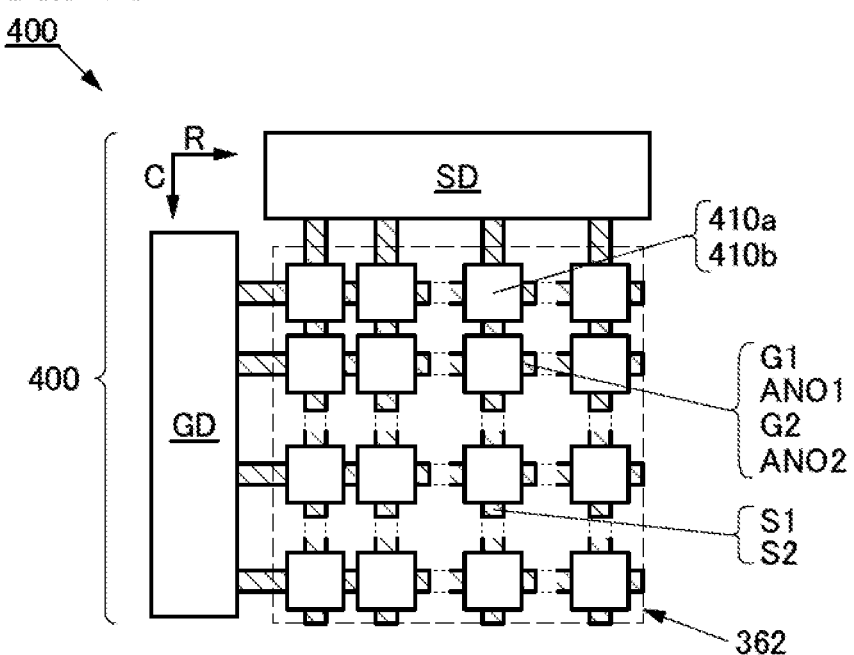
FIG. 17 is a block diagram of a display device according to an embodiment.

FIG. 17 is a block diagram illustrating an example of the structure of a display device 400.

The display device 400 includes a plurality of pixels (a pixel 410a and a pixel 410b) that are arranged in a matrix in a display portion 362. The display device 400 also includes a circuit GD and a circuit SD.

The display device 400 includes a plurality of wirings G1, a plurality of wirings G2, a plurality of wirings ANO1, and a plurality of wirings ANO2 which electrically connect the circuit GD and the plurality of pixels 410a or 410b arranged in a direction R. In addition, the display device 400 includes a plurality of wirings S1 and a plurality of wirings S2 which electrically connect the circuit SD and a plurality of pixels 410a or 410b arranged in a direction C.

The pixel 410a and the pixel 410b each include a light-emitting element. The light-emitting element of the pixel 410a and the light-emitting element of the pixel 410b have a region where they do not overlap with each other.

The pixel 410a and the pixel 410b may each function as a subpixel.

Circuit Structure Example

Figure 18:
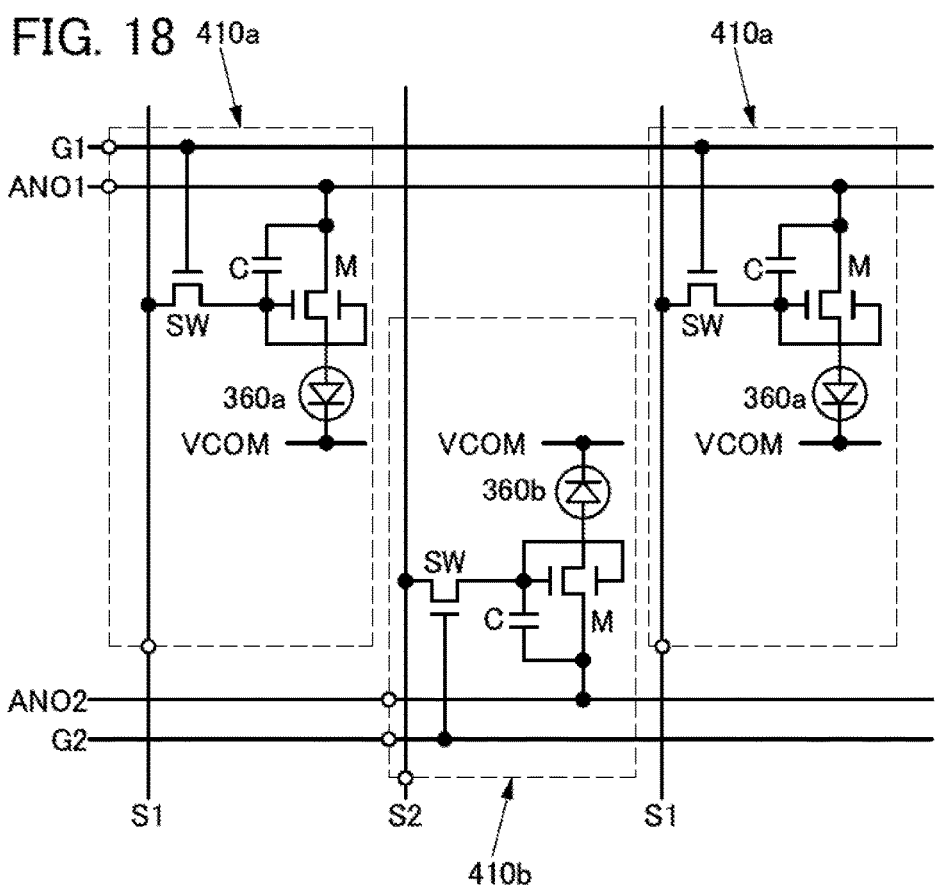
FIG. 18 is a circuit diagram of a display device according to an embodiment.

FIG. 18 is a circuit diagram illustrating a structure example of the pixel 410a and the pixel 410b provided in the display portion 362. FIG. 18 shows three adjacent pixels.

The pixel 410a and the pixel 410b are similar in structure except the connecting wirings. Thus, the common components may be described for either one of them.

Each of the pixel 410a and the pixel 410b includes a switch SW, a transistor M, a capacitor C, a light-emitting element 360a or a light-emitting element 360b, and the like. The pixel 410a is electrically connected to a wiring G1, a wiring ANO1, and a wiring S1. The pixel 410b is electrically connected to a wiring G2, a wiring ANO2, and a wiring S2.

In the pixel 410a, a gate of the switch SW is connected to the wiring G1. One of a source and a drain of the switch SW is connected to the wiring S1, and the other of the source and the drain is connected to one electrode of the capacitor C and a gate of the transistor M. The other electrode of the capacitor C is connected to one of a source and a drain of the transistor M and the wiring ANO1. The other of the source and the drain of the transistor M is connected to one electrode of the light-emitting element 360a. The other electrode of the light-emitting element 360a is connected to the wiring VCOM.

FIG. 18 illustrates an example in which the transistor M includes two gates between which a semiconductor is sandwiched and which are connected to each other. This structure can increase the amount of current flowing through the transistor M.

The wiring G1 and the wiring G2 can be supplied with a signal for controlling the conduction state (on/off state) of the switch SW. The wiring VCOM and the wirings ANO can be supplied with potentials having a difference large enough to make the light-emitting element 360a or the light-emitting element 360b emit light. The wiring S1 and the wiring S2 can be supplied with a signal for controlling the conduction state of the transistor M.

At least part of this embodiment can be implemented in combination with any of the other embodiments described in this specification as appropriate.

Embodiment 3

In this embodiment, a display module that can be manufactured using one embodiment of the present invention will be described.

Figure 19:
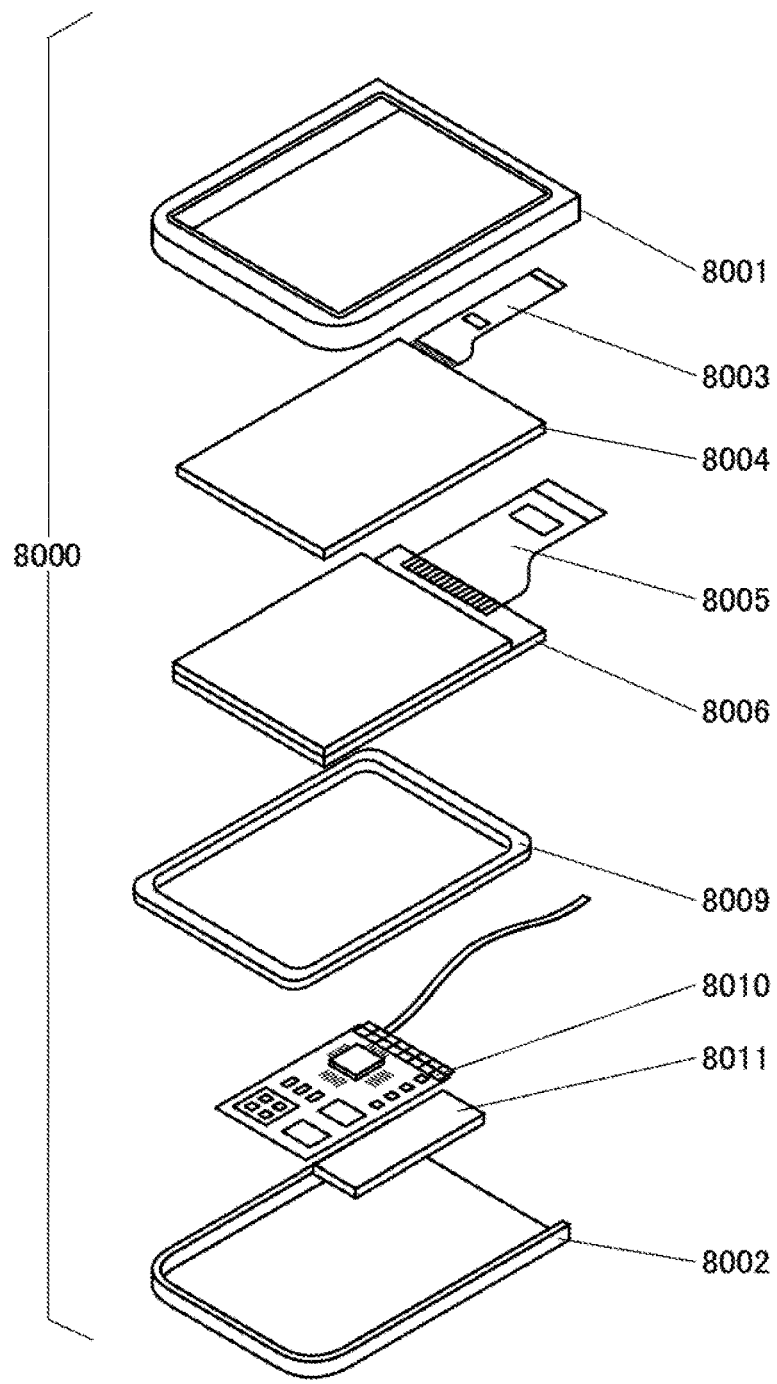
FIG. 19 illustrates a structure example of a display module according to an embodiment.

In a display module 8000 in FIG. 19, a touch panel 8004 connected to an FPC 8003, a display panel 8006 connected to an FPC 8005, a frame 8009, a printed circuit board 8010, and a battery 8011 are provided between an upper cover 8001 and a lower cover 8002.

The display device manufactured using one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may overlap with the display panel 8006. Instead of providing the touch panel 8004, the display panel 8006 can be made to have a touch panel function.

The frame 8009 protects the touch panel 8004 and functions as an electromagnetic shield for blocking electromagnetic waves generated by the operation of the printed circuit board 8010. The frame 8009 may also function as a radiator plate.

The printed circuit board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

At least part of this embodiment can be implemented in appropriate combination with any of the other embodiments described in this specification.

Embodiment 4

In this embodiment, electronic devices to which the display device of one embodiment of the present invention can be applied will be described.

The display device of one embodiment of the present invention can be used for a display portion of an electronic device. As a result, the electronic device can have high display quality, extremely high resolution, or high reliability.

Examples of electronic devices include a television set, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

The electronic device or the lighting device of one embodiment of the present invention can be incorporated along a curved inside/outside wall surface of a house or a building or a curved interior/exterior surface of a car.

The electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a nickel-metal hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of photographing a still image or a moving image, a function of automatically or manually correcting a photographed image, a function of storing a photographed image in a recording medium (an external recording medium or a recording medium incorporated in the electronic device), a function of displaying a photographed image on a display portion, or the like. Note that the functions of the electronic devices of embodiments of the present invention are not limited thereto, and the electronic devices can have a variety of functions.

The display device of one embodiment of the present invention can display images with extremely high resolution. For this reason, the display device can be used particularly for portable electronic devices, wearable electronic devices (wearable devices), e-book readers, and the like. In addition, the display device can be suitably used for virtual reality (VR) devices, augmented reality (AR) devices, and the like.

Figure 20A:
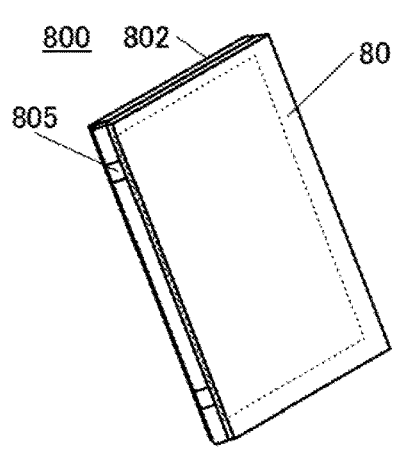
FIGS. 20A to 20D each illustrate an electronic device according to an embodiment.
Figure 20B:
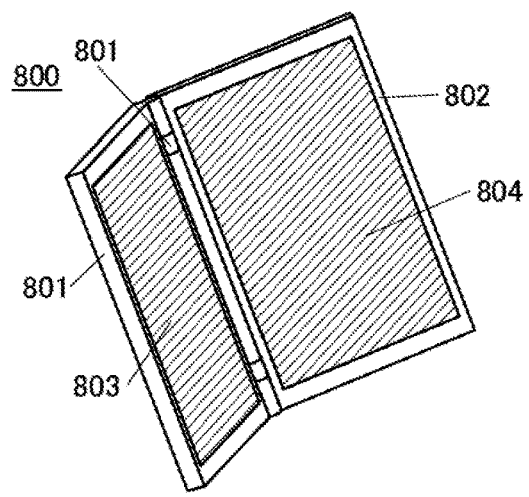

FIGS. 20A and 20B illustrate an example of a portable information terminal 800. The portable information terminal 800 includes a housing 801, a housing 802, a display portion 803, a display portion 804, and a hinge portion 805, for example.

The housing 801 and the housing 802 are connected with the hinge portion 805. The portable information terminal 800 folded as in FIG. 20A can be changed into the state illustrated in FIG. 20B, in which the housing 801 and the housing 802 are opened.

For example, the portable information terminal 800 can also be used as an e-book reader, in which the display portion 803 and the display portion 804 each can display text data. In addition, the display portion 803 and the display portion 804 each can display a still image or a moving image.

In this manner, the portable information terminal 800 has high versatility because it can be folded when carried.

Note that the housing 801 and the housing 802 may include a power switch, an operation button, an external connection port, a speaker, a microphone, and/or the like.

Figure 20C:
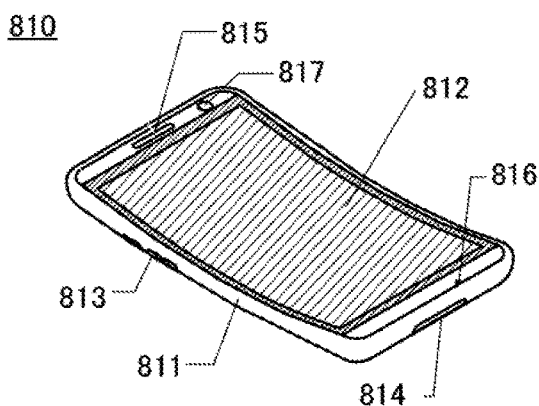

FIG. 20C illustrates an example of a portable information terminal. A portable information terminal 810 illustrated in FIG. 20C includes a housing 811, a display portion 812, operation buttons 813, an external connection port 814, a speaker 815, a microphone 816, a camera 817, and the like.

The display portion 812 is provided with the display device of one embodiment of the present invention.

The portable information terminal 810 includes a touch sensor in the display portion 812. Operations such as making a call and inputting a letter can be performed by touch on the display portion 812 with a finger, a stylus, or the like.

With the operation buttons 813, power on/off can be switched and types of images displayed on the display portion 812 can be switched. For example, images can be switched from a mail creation screen to a main menu screen.

When a detection device such as a gyroscope sensor or an acceleration sensor is provided inside the portable information terminal 810, the direction of display on the screen of the display portion 812 can be automatically changed by determining the orientation of the portable information terminal 810 (whether the portable information terminal 810 is placed horizontally or vertically). The direction of display on the screen can also be changed by touch on the display portion 812, operation with the operation buttons 813, sound input using the microphone 816, or the like.

The portable information terminal 810 has one or more of a telephone function, a notebook function, an information browsing function, and the like. Specifically, the portable information terminal 810 can be used as a smartphone. The portable information terminal 810 is capable of executing a variety of applications such as mobile phone calls, e-mailing, viewing and editing texts, music reproduction, video replay, Internet communication, and games.

Figure 20D:
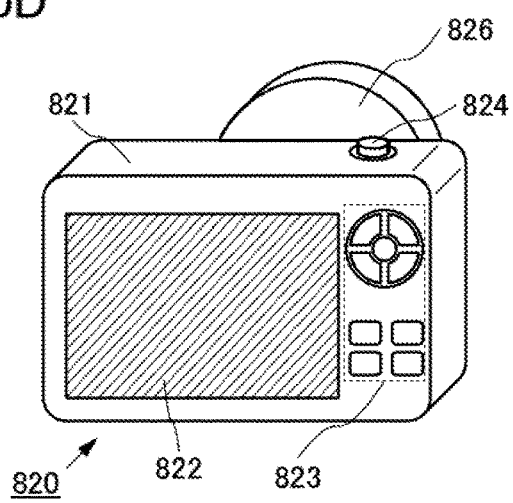

FIG. 20D illustrates an example of a camera. A camera 820 includes a housing 821, a display portion 822, operation buttons 823, a shutter button 824, and the like. The camera 820 is provided with an attachable lens 826.

The display portion 822 is provided with the display device of one embodiment of the present invention.

Although the lens 826 of the camera 820 here is detachable from the housing 821 for replacement, the lens 826 may be integrated with the housing 821.

Still images or moving images can be taken with the camera 820 by pushing the shutter button 824. In addition, images can be taken by a touch on the display portion 822 that serves as a touch panel.

Note that a stroboscope, a viewfinder, or the like can be additionally provided in the camera 820. Alternatively, these can be incorporated in the housing 821.

Figure 21A:
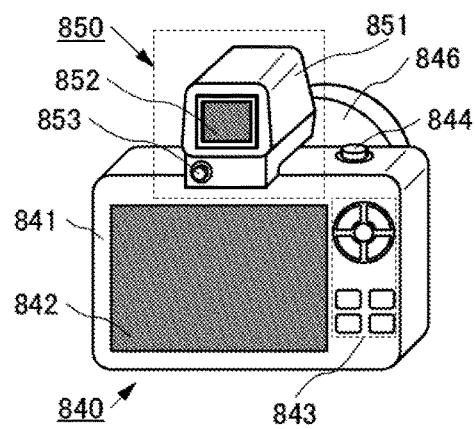
FIGS. 21A to 21E each illustrate an electronic device according to an embodiment.

FIG. 21A is an external view of a camera 840 to which a finder 850 is attached.

The camera 840 includes a housing 841, a display portion 842, an operation button 843, a shutter button 844, and the like. Furthermore, an attachable lens 846 is attached to the camera 840.

Although the lens 846 of the camera 840 here is detachable from the housing 841 for replacement, the lens 846 may be built in a housing.

When the shutter button 844 is pressed, the camera 840 can take images. In addition, the display portion 842 has a function of a touch panel, and images can be taken when the display portion 842 is touched.

The housing 841 of the camera 840 has a mount including an electrode, and the finder 850, a stroboscope, and the like can be connected.

The finder 850 includes a housing 851, a display portion 852, a button 853, and the like.

The housing 851 includes a mount for engagement with the mount of the camera 840 so that the finder 850 can be connected to the camera 840. The mount includes an electrode, and a moving image or the like received from the camera 840 through the electrode can be displayed on the display portion 852.

The button 853 serves as a power button. The display portion 852 can be turned on and off using the button 853.

The display device of one embodiment of the present invention can be used for the display portion 842 of the camera 840 and the display portion 852 of the finder 850.

Although the camera 840 and the finder 850 are separate and detachable electronic devices in FIG. 21A, a finder including the display device of one embodiment of the present invention may be built in the housing 841 of the camera 840.

Figure 21B:
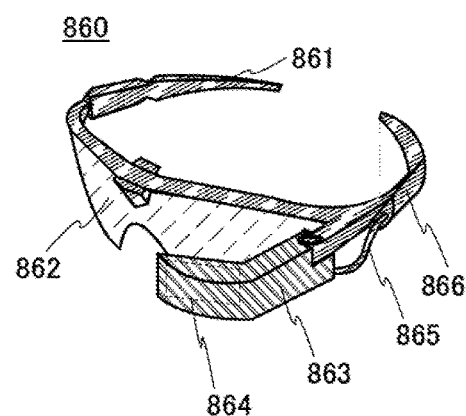

FIG. 21B is an external view of a head-mounted display 860.

The head-mounted display 860 includes a mounting portion 861, a lens 862, a main body 863, a display portion 864, a cable 865, and the like. In addition, a battery 866 is built in the mounting portion 861.

Power is supplied from the battery 866 to the main body 863 through the cable 865. The main body 863 includes a wireless receiver or the like to receive video data such as image data and display it on the display portion 864. The movement of the user's eyeball or eyelid is captured by a camera in the main body 863 and then the coordinates of the eyepoint are calculated using the captured data to utilize the user's eye as an input portion.

A plurality of electrodes may be provided in in a portion of the mounting portion 861 a user touches. The main body 863 may have a function of sensing a current flowing through the electrodes with the movement of the user's eyeball to determine the location of the eyepoint. The main body 863 may have a function of sensing a current flowing through the electrodes to monitor the user's pulse. The mounting portion 861 may include sensors such as a temperature sensor, a pressure sensor, or an acceleration sensor so that the user's biological information can be displayed on the display portion 864. The main body 863 may sense the movement of the user's head or the like to move an image displayed on the display portion 864 in synchronization with the movement of the user's head, or the like.

The display device of one embodiment of the present invention can be used for the display portion 864.

Figure 21C:
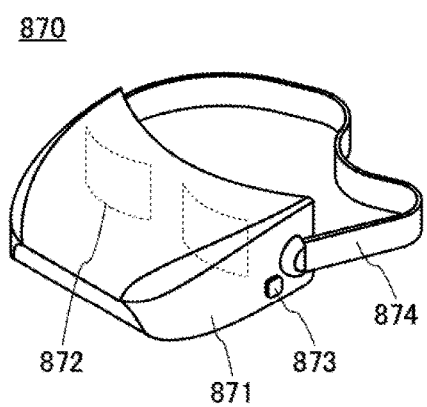
Figure 21D:
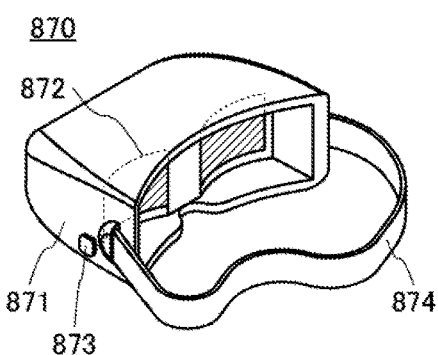

FIGS. 21C and 21D are external views of a head-mounted display 870.

The head-mounted display 870 includes a housing 871, two display portions 872, an operation button 873, and a fixing band 874.

The head-mounted display 870 has the functions of the above-described head-mounted display 860 and includes two display portions.

Since the head-mounted display 870 includes the two display portions 872, the user's eyes can see their respective display portions. Thus, a high-definition image can be displayed even when a three-dimensional display using parallax, or the like, is performed. In addition, the display portion 872 is curved around an arc with the user's eye as an approximate center. Owing to this, the distance between the user's eye and the display surface of the display portion is uniform; thus, the user can see a more natural image. Even when the luminance or chromaticity of light emitted from the display portion varies depending on the user' viewing angle, the influence of the variation can be substantially ignorable and thus a more realistic image can be displayed because the user's eye is positioned in the normal direction of the display surface of the display portion.

The operation button 873 serves as a power button or the like. A button other than the operation button 873 may be included.

Figure 21E:
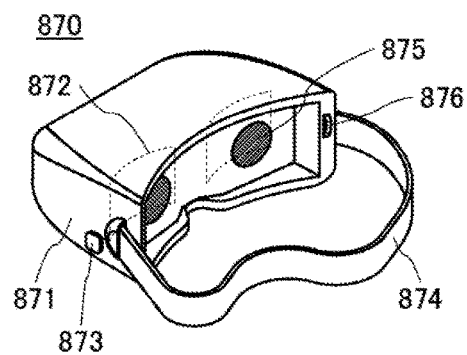

As illustrated in FIG. 21E, lenses 875 may be provided between the display portion 872 and the user's eyes. The user can see magnified images on the display portion 872 through the lenses 875, leading to higher sense of presence. In that case, as illustrated in FIG. 21E, a dial 876 for changing the position of the lenses and adjusting visibility may be included.

The display device of one embodiment of the present invention can be used for the display portion 872. Since the display device of one embodiment of the present invention has extremely high definition, even when an image is magnified using the lenses 875 as illustrated in FIG. 21E, the pixels are not perceived by the user, and thus a more realistic image can be displayed.

Figure 22A:
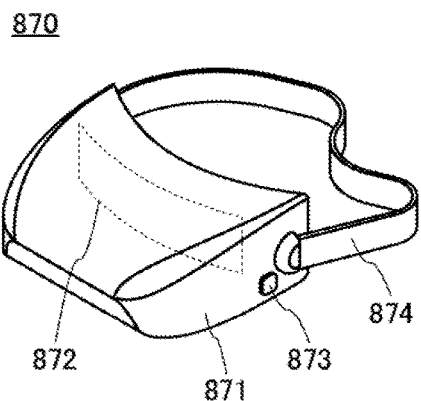
FIGS. 22A to 22D each illustrate an electronic device according to an embodiment.
Figure 22B:
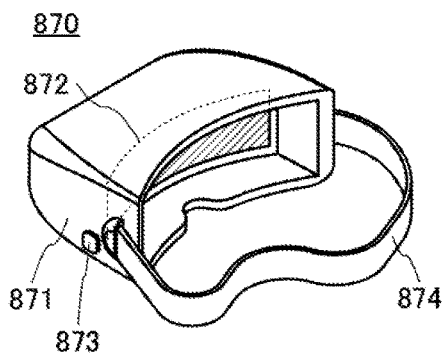

FIGS. 22A and 22B illustrate an example in which the head-mounted display includes one display portion 872. This structure can reduce the number of components.

The display portion 872 can display an image for the right eye and an image for the left eye side by side on a right region and a left region, respectively. Thus, a three-dimensional moving image using binocular disparity can be displayed.

One image which can be seen by both eyes may be displayed on the entire display portion 872. A panorama moving image can thus be displayed from end to end of the field of view; thus, the sense of reality is increased.

The lenses 875 may be provided. Two images may be displayed side by side on the display portion 872. Alternatively, one image may be displayed on the display portion 872 and seen by both eyes through the lenses 875.

Figure 22C:
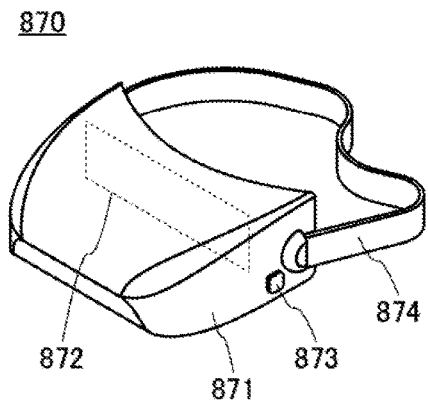
Figure 22D:
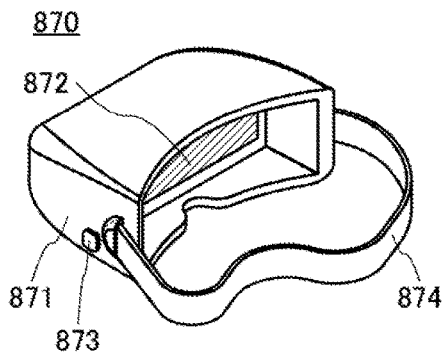

The display portion 872 is not necessarily curved and may have a flat display surface as shown in an example of FIGS. 22C and 22D in which the display portion 872 does not have a curved surface, for example.

At least part of this embodiment can be implemented in combination with any of the other embodiments described in this specification as appropriate.

This application is based on Japanese Patent Application Serial No. 2016-136301 filed with Japan Patent Office on Jul. 8, 2016, the entire contents of which are hereby incorporated by reference.

What is claimed is:

1. A display device having a display portion comprising:
a first insulating layer;
a first display element;
a second display element; and
a third display element,
wherein the second display element and the third display element are provided on opposite to the first display element with the first insulating layer positioned therebetween,
wherein the display portion has a region in which the first display element and the second display element do not overlap with each other and a region in which the first display element and the third display element do not overlap with each other,
wherein the first display element comprises a first light-emitting layer configured to emit first light,
wherein the second display element comprises a second light-emitting layer configured to emit second light,
wherein the third display element comprises a third light-emitting layer configured to emit third light,
wherein the second light-emitting layer and the third light-emitting layer are positioned apart from each other, and
wherein the first light, the second light, and the third light are of different colors from one another and emitted to a same direction.

2. The display device according to claim 1,
wherein the second light and the third light are emitted toward the first insulating layer and pass through the first insulating layer.

3. The display device according to claim 1,
wherein the first light is emitted toward the first insulating layer and passes through the first insulating layer.

4. The display device according to claim 1, further comprising:
a first transistor;
a second transistor;
a second insulating layer; and
a third insulating layer,
wherein the first transistor and the second transistor are positioned on a same surface of the second insulating layer,
wherein the second insulating layer is positioned between the first display element and the first transistor,
wherein the third insulating layer is positioned between the second display element and the second transistor,
wherein a part of the first insulating layer is a gate insulating layer of the first transistor and another part of the first insulating layer is a gate insulating layer of the second transistor,
wherein the first transistor and the first display element are electrically connected to each other through a first opening included in the second insulating layer, and
wherein the second transistor and the second display element are electrically connected to each other through a second opening included in the third insulating layer.

5. The display device according to claim 4,
wherein the first display element further comprises a first conductive layer and a second conductive layer,
wherein the second display element further comprises a third conductive layer and a fourth conductive layer,
wherein the first conductive layer, the first light-emitting layer, and the second conductive layer are stacked in this order from the second insulating layer,
wherein the first conductive layer is electrically connected to the first transistor through the first opening,
wherein the third conductive layer, the second light-emitting layer, and the fourth conductive layer are stacked in this order from the third insulating layer, and
wherein the third conductive layer is electrically connected to the second transistor through the second opening.

6. The display device according to claim 5,
wherein a surface of the first conductive layer being in contact with the first light-emitting layer and a surface of the second insulating layer being in contact with the first light-emitting layer are positioned on a same plane.

7. The display device according to claim 5,
wherein a surface of the third conductive layer on the second light-emitting layer and a surface of the third insulating layer on the second light-emitting layer are positioned on a same plane.

8. The display device according to claim 1,
wherein the second light-emitting layer comprises a phosphorescent material,
wherein the third light-emitting layer comprises a fluorescent material, and
wherein the third light-emitting layer comprises a region overlapping with the second light-emitting layer.

9. The display device according to claim 1,
wherein the third light comprises light with a wavelength shorter than a wavelength of the second light, and
wherein the third light-emitting layer comprises a region overlapping with the second light-emitting layer.

10. The display device according to claim 1, comprising:
a plurality of first display elements;
a plurality of second display elements; and
a plurality of third display elements,
wherein the plurality of second display elements alternate with the plurality of third display elements in a first direction,
wherein adjacent two of the plurality of second display elements are aligned in a second direction orthogonal to the first direction,
wherein adjacent two of the plurality of third display elements are aligned in the second direction, and
wherein one of the plurality of first display elements is positioned between one of the plurality of second display elements and one of the plurality of third display elements which are adjacent to each other in the first direction.

11. The display device according to claim 1, comprising:
a plurality of first display elements;
a plurality of second display elements; and
a plurality of third display elements,
wherein the plurality of second display elements alternate with the plurality of third display elements in a third direction and a fourth direction orthogonal to the third direction,
wherein first one of the plurality of first display elements is positioned between first one of the plurality of second display elements and first one of the plurality of third display elements which are adjacent to each other in the third direction, and
wherein second one of the plurality of first display elements is positioned between second one of the plurality of second display elements and second one of the plurality of third display elements which are adjacent to each other in the fourth direction.

12. A display device having a display portion comprising:
a first insulating layer;
a plurality of first display elements over the first insulating layer;
a plurality of second display elements under the first insulating layer; and
a plurality of third display elements under the first insulating layer,
wherein the display portion has a region in which one of the plurality of first display elements and one of the plurality of second display elements do not overlap with each other and a region in which one of the plurality of first display elements and the plurality of third display elements do not overlap with each other,
wherein each of the plurality of first display elements comprises a first light-emitting layer configured to emit first light,
wherein each of the plurality of second display elements comprises a second light-emitting layer configured to emit second light,
wherein each of the plurality of third display elements comprises a third light-emitting layer configured to emit third light,
wherein the second light-emitting layer and the third light-emitting layer are positioned apart from each other, and
wherein the first light, the second light, and the third light are of different colors from one another and emitted to a same direction.

13. The display device according to claim 12, further comprising:
a first transistor;
a second transistor;
a second insulating layer over the first transistor and the second transistor; and
a third insulating layer,
wherein the first transistor and the second transistor are positioned on a same surface of the second insulating layer,
wherein the second insulating layer is positioned between one of the plurality of first display elements and the first transistor,
wherein the third insulating layer is positioned between one of the plurality of second display elements and the second transistor,
wherein a part of the first insulating layer is a gate insulating layer of the first transistor and another part of the first insulating layer is a gate insulating layer of the second transistor,
wherein the first transistor and the one of the plurality of first display elements are electrically connected to each other through a first opening included in the second insulating layer, and
wherein the second transistor and the one of the plurality of second display elements are electrically connected to each other through a second opening included in the third insulating layer.

14. The display device according to claim 13,
wherein each of the plurality of first display elements further comprises a first conductive layer and a second conductive layer,
wherein each of the plurality of second display elements further comprises a third conductive layer and a fourth conductive layer,
wherein the first conductive layer, the first light-emitting layer, and the second conductive layer are stacked in this order from the second insulating layer,
wherein the first conductive layer is electrically connected to the first transistor through the first opening,
wherein the third conductive layer, the second light-emitting layer, and the fourth conductive layer are stacked in this order from the third insulating layer, and
wherein the third conductive layer is electrically connected to the second transistor through the second opening.

15. The display device according to claim 14,
wherein a surface of the first conductive layer being in contact with the first light-emitting layer and a surface of the second insulating layer being in contact with the first light-emitting layer are positioned on a same plane.

16. The display device according to claim 12,
wherein the second light-emitting layer comprises a phosphorescent material,
wherein the third light-emitting layer comprises a fluorescent material, and
wherein the third light-emitting layer comprises a region overlapping with the second light-emitting layer.

17. The display device according to claim 12,
wherein the third light comprises light with a wavelength shorter than a wavelength of the second light, and
wherein the third light-emitting layer comprises a region overlapping with the second light-emitting layer.

18. The display device according to claim 12,
wherein the plurality of second display elements alternate with the plurality of third display elements in a first direction,
wherein adjacent two of the plurality of second display elements are aligned in a second direction orthogonal to the first direction,
wherein adjacent two of the plurality of third display elements are aligned in the second direction, and
wherein one of the plurality of first display elements is positioned between one of the plurality of second display elements and one of the plurality of third display elements which are adjacent to each other in the first direction.

19. The display device according to claim 12,
wherein the plurality of second display elements alternate with the plurality of third display elements in a third direction and a fourth direction orthogonal to the third direction,
wherein first one of the plurality of first display elements is positioned between first one of the plurality of second display elements and first one of the plurality of third display elements which are adjacent to each other in the third direction, and
wherein second one of the plurality of first display elements is positioned between second one of the plurality of second display elements and second one of the plurality of third display elements which are adjacent to each other in the fourth direction.

20. A display device having a display portion comprising:
a first insulating layer;
a plurality of first display elements under the first insulating layer;
a plurality of second display elements over the first insulating layer; and
a plurality of third display elements over the first insulating layer,
wherein the display portion has a region in which one of the plurality of first display elements and one of the plurality of second display elements do not overlap with each other and a region in which one of the plurality of first display elements and the plurality of third display elements do not overlap with each other, wherein each of the plurality of first display elements comprises a first light-emitting layer configured to emit first light, wherein each of the plurality of second display elements comprises a second light-emitting layer configured to emit second light, wherein each of the plurality of third display elements comprises a third light-emitting layer configured to emit third light, wherein the second light-emitting layer and the third light-emitting layer are positioned apart from each other, and wherein the first light, the second light, and the third light are of different colors from one another and emitted to a same direction.

21. The display device according to claim 20, further comprising:

a first transistor;

a second transistor;

a second insulating layer under the first transistor and the second transistor; and a third insulating layer, wherein the first transistor and the second transistor are positioned on a same surface of the second insulating layer, wherein the second insulating layer is positioned between one of the plurality of first display elements and the first transistor, wherein the third insulating layer is positioned between one of the plurality of second display elements and the second transistor, wherein a part of the first insulating layer is a gate insulating layer of the first transistor and another part of the first insulating layer is a gate insulating layer of the second transistor, wherein the first transistor and the one of the plurality of first display elements are electrically connected to each other through a first opening included in the second insulating layer, and wherein the second transistor and the one of the plurality of second display elements are electrically connected to each other through a second opening included in the third insulating layer.

22. The display device according to claim 21, wherein each of the plurality of first display elements further comprises a first conductive layer and a second conductive layer, wherein each of the plurality of second display elements further comprises a third conductive layer and a fourth conductive layer, wherein the first conductive layer, the first light-emitting layer, and the second conductive layer are stacked in this order from the second insulating layer, wherein the first conductive layer is electrically connected to the first transistor through the first opening, wherein the third conductive layer, the second light-emitting layer, and the fourth conductive layer are stacked in this order from the third insulating layer, and wherein the third conductive layer is electrically connected to the second transistor through the second opening.

23. The display device according to claim 22, wherein a surface of the first conductive layer being in contact with the first light-emitting layer and a surface of the second insulating layer being in contact with the first light-emitting layer are positioned on a same plane.

24. The display device according to claim 20, wherein the second light-emitting layer comprises a phosphorescent material, wherein the third light-emitting layer comprises a fluorescent material, and wherein the third light-emitting layer comprises a region overlapping with the second light-emitting layer.

25. The display device according to claim 20, wherein the third light comprises light with a wavelength shorter than a wavelength of the second light, and wherein the third light-emitting layer comprises a region overlapping with the second light-emitting layer.

26. The display device according to claim 20, wherein the plurality of second display elements alternates with the plurality of third display elements in a first direction, wherein adjacent two of the plurality of second display elements are aligned in a second direction orthogonal to the first direction, wherein adjacent two of the plurality of third display elements are aligned in the second direction, and wherein one of the plurality of first display elements is positioned between one of the plurality of second display elements and one of the plurality of third display elements which are adjacent to each other in the first direction.

27. The display device according to claim 20, wherein the plurality of second display elements alternate with the plurality of third display elements in a third direction and a fourth direction orthogonal to the third direction, wherein first one of the plurality of first display elements is positioned between first one of the plurality of second display elements and first one of the plurality of third display elements which are adjacent to each other in the third direction, and wherein second one of the plurality of first display elements is positioned between second one of the plurality of second display elements and second one of the plurality of third display elements which are adjacent to each other in the fourth direction.

* * * * *